(12) United States Patent
Li

(10) Patent No.: US 11,646,344 B2
(45) Date of Patent: May 9, 2023

(54) METHOD FOR MAKING SUPER JUNCTION DEVICE

(71) Applicant: SHANGHAI HUAHONG GRACE SEMICONDUCTOR MANUFACTURING CORPORATION, Shanghai (CN)

(72) Inventor: Hao Li, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 116 days.

(21) Appl. No.: 17/329,531

(22) Filed: May 25, 2021

(65) Prior Publication Data

US 2021/0376060 A1 Dec. 2, 2021

(30) Foreign Application Priority Data

May 29, 2020 (CN) .......................... 202010475492.5

(51) Int. Cl.
| | |
|---|---|
| *H01L 29/06* | (2006.01) |
| *H01L 29/40* | (2006.01) |
| *H01L 29/423* | (2006.01) |
| *H01L 29/78* | (2006.01) |
| *H01L 29/66* | (2006.01) |

(52) U.S. Cl.
CPC ...... *H01L 29/0607* (2013.01); *H01L 29/0634* (2013.01); *H01L 29/401* (2013.01); *H01L 29/4236* (2013.01); *H01L 29/66734* (2013.01); *H01L 29/7813* (2013.01)

(58) Field of Classification Search
CPC ........... H01L 29/4236; H01L 29/66734; H01L 29/7813; H01L 29/0634; H01L 29/0607
See application file for complete search history.

(56) References Cited

U.S. PATENT DOCUMENTS

| | | | |
|---|---|---|---|
| 2006/0157813 A1* | 7/2006 | Saito | .................... H01L 29/407 |
| | | | 257/E29.136 |
| 2016/0268367 A1* | 9/2016 | Ishiguro | .............. H01L 29/7813 |
| 2019/0252517 A1* | 8/2019 | Kawada | ............ H01L 21/02529 |
| 2020/0235230 A1* | 7/2020 | Zhang | ................. H01L 29/6634 |
| 2021/0320171 A1* | 10/2021 | Nishimura | .......... H01L 29/0634 |
| 2022/0020858 A1* | 1/2022 | Zhao | ................... H01L 29/4983 |

FOREIGN PATENT DOCUMENTS

CN 104103524 A * 10/2014 ........... H01L 21/265

* cited by examiner

*Primary Examiner* — Joseph C. Nicely
(74) *Attorney, Agent, or Firm* — Dilworth IP, LLC

(57) ABSTRACT

A method for making a super junction device includes the following steps: step 1: forming a trench gate, in the forming process of the trench gate, a polysilicon gate being used to fill gate trenches and then first flattening being performed and the width of the gate trench at the leading-out position of the gate structure satisfies the requirement of forming contacts; and step 2: forming a super junction, in the forming process of the super junction, a second epitaxial layer being used to fill a super junction trench and then second flattening being performed. The method can realize an all flat process, can conveniently arrange the trench gate process before the forming process of the super junction, can decrease the thermal processes after the formation of the super junction, can save the mask and can decrease the process cost.

17 Claims, 16 Drawing Sheets

METHOD FOR MAKING SUPER JUNCTION DEVICE

CROSS-REFERENCE TO RELATED APPLICATION

This application claims the priority to Chinese patent application No. CN 202010475492.5 filed at CNIPA on May 29, 2020, and entitled "METHOD FOR MAKING SUPER JUNCTION DEVICE", the disclosure of which is incorporated herein by reference in entirety.

TECHNICAL FIELD

The disclosure relates to a method for making a semiconductor integrated circuit, in particular to a method for making a super junction device.

BACKGROUND

A super junction consists of alternately arranged P-type thin layers (also known as P-type pillars) and N-type thin layers (also known as N-type pillars) formed in a semiconductor substrate. Devices using a super junction are super junction devices, for example, super junction MOSFETs. By adopting the reduced surface field (Resurf) technique with balanced P-type and N-type thin layer charges, the reverse breakdown voltage of the device can be improved and the on resistance can be at the same time maintained to be small.

The pillar structure of PN alternating arrangement of super junction is the biggest characteristic of super junction. There are two methods to fabricate PN pillar structure. One is to obtain the pillar structure through repetitive epitaxial growth and ion implantation, and the other is to obtain the pillar structure through deep trench etching and epitaxial (EPI) filling. The latter method is to fabricate the super junction device through a trench process. Firstly, trenches with certain depth and width need to be etched in an N-type doped epitaxial layer on the surface of a semiconductor substrate, for example, a silicon substrate, and then P-type doped epitaxial silicon is filled in the etched trenches through EPI filling.

With the continuous reduction of the pitch of the super junction, the problem caused by counter dope formed by the mutual diffusion of P-type and N-type dope of P-type and N-type pillars in the thermal processes becomes more and more serious, which seriously influences the device performance.

Referring to FIG. 1, it is a schematic structural view of mutual diffusion of an existing super junction, which mainly includes:

an N-type epitaxial layer 102 formed on the surface of an N-type semiconductor substrate, for example, a silicon substrate 101. Super junction trenches 103 are formed in the N-type epitaxial layer 102. In the application, the trenches corresponding to the super junction are called as super junction trenches. A P-type epitaxial layer is filled in the super junction trenches 103, the P-type epitaxial layer filled in the super junction trenches forms P-type pillars 104, the N-type epitaxial layer 102 between the P-type pillars 104 forms the N-type pillars, and the P-type pillars 104 and N-type pillars are arranged alternately to form a super junction. Generally, impurities in the P-type pillars 104 and N-type pillars of the super junction will mutually diffuse in the thermal process. For example, the P-type impurities in the P-type pillars 104 will diffuse into the N-type pillars. The area corresponding to reference sign 105 in FIG. 1 is the area where the P-type impurities in the P-type pillars 104 diffuse into the N-type pillars. After the P-type impurities diffuse into the N-type pillars, the N-type doping concentration, i.e., the N-type net doping concentration, of the N-type pillars will decrease or the width of the N-type pillars will decrease. In the N-type super junction device, the N-type pillars are usually used as a part of a drift region in the conduction process. When the doping concentration of the N-type pillars decreases and the width becomes smaller, the on resistance of the device will decrease.

As the pitch of the super junction decreases, the ratio of the width range influenced by the mutual diffusion of P-type and N-type impurities produced in the thermal processes in the super junction, for example, the width of area 105 in FIG. 1, to the total width of the pitch increases, and the total width of the pitch is the sum of the width and spacing of the super junction trenches 103, which will seriously influence the performance of the device.

Referring to FIG. 2, it is a flowchart of an existing method for making a super junction device. In FIG. 2, photolithography process steps are used to describe the flow of the method for making the super junction device, and a layer of mask is used in the photolithography process of each layer and is subjected to the photolithography process. The existing method for making the super junction device includes the following steps:

In a first layer photolithography process, a zero layer alignment mark is formed. The zero layer alignment mark is formed on a scribing line, and the zero layer alignment mark needs to be used for alignment in the photolithography process of a second layer corresponding to the subsequent formation of a body region. The zero layer alignment mark is defined through a zero layer mask (ZM), and is represented by Mask1 in the disclosure.

In a second layer photolithography process, body region implantation and driving are performed. Sampling for body region implantation needs to be defined by adopting Mask2.

In a third layer photolithography process, super junction trench etching and filling are performed. The forming area of the super junction trenches need to be defined by adopting Mask3.

In a fourth layer photolithography process, deposition and etching of a field oxide are performed. The etching area of the field oxide needs to be defined by adopting Mask4. The field oxide is usually formed on the surface of a terminal region. The terminal region surrounds the device cell region, i.e., the current flow region, that is, the peripheral side of an active region. Therefore, before the structure of the device cell region is formed, the field oxide in the device cell region needs to be removed.

In a fifth layer photolithography process, etching of gate trenches is performed, and a gate oxide layer and a polysilicon gate are formed. In the disclosure, trenches corresponding to a trench gate are called as gate trenches. The gate trenches need to be defined by adopting Mask5.

In a sixth layer photolithography process, the photolithography process and etching process of polysilicon, and the implantation and driving of the body region are performed. Herein, Mask6 is adopted to define the etching area of polysilicon. After the photolithography and etching of polysilicon, the leading-out structure of the polysilicon gate with the trench gate can be formed. The leading-out structure of the polysilicon gate is usually located in the terminal region, so the polysilicon of the leading-out structure needs to climb a slope between the field oxide and the active region.

The implantation of the body region here does not need to be defined through photolithography any longer.

In a seventh layer photolithography process, implantation and driving of a source region are performed. The implantation area of the source region is defined by adopting Mask7.

In an eighth layer photolithography process, deposition of an interlayer film, etching of contacts (CT), and implantation and driving of a body region leading-out region are performed. The etching area of the contacts is defined by adopting Mask8.

In a ninth layer photolithography process, deposition and etching of a front metal layer are performed. The etching area of the front metal layer is defined by adopting Mask9.

In a tenth layer photolithography process, deposition and etching of a contact pad (CP) are performed. The etching area of the contact pad is defined by adopting Mask10.

Accordingly, it can be seen that, in the existing method, ten photolithography processes are required. After the formation of the super junction, there are many subsequent thermal processes. Therefore, the super junction formed by adopting the existing method is easily influenced by the thermal processes, and serious mutual diffusion is caused, which will decrease the performance of the device.

BRIEF SUMMARY

The technical problem to be actually solved by the disclosure is to provide a method for making a super junction device, which can decrease the thermal processes after the formation of the super junction, so as to decrease the mutual diffusion of the impurities of the super junction and improve the device performance.

In order to solve the above technical problem, the method for making the super junction device provided by the disclosure is realized by adopting an all flat process such that the forming process of a gate structure is before the forming process of a super junction, and includes the following steps:

step 1: forming the gate structure, the gate structure being a trench gate, the forming process of the trench gate including:

providing a first conducting type first epitaxial layer and performing a photolithography process to define the forming area of gate trenches;

etching the first epitaxial layer to form the gate trenches, the width of the gate trench at the leading-out position of the gate structure satisfying the requirement of forming contacts;

step 2: performing the forming process of the super junction, including:

performing a photolithography process to the flat surface of the first epitaxial layer with the trench gate to define the forming area of super junction trenches;

etching the first epitaxial layer to form the super junction trenches;

filling a second conducting type second epitaxial layer in the super junction trenches, the second epitaxial layer filled in the super junction trenches forming second conducting type pillars, the first epitaxial layer between the second conducting type pillars forming first conducting type pillars, and the first conducting type pillars and the second conducting type pillars being arranged alternately to form the super junction;

performing second flattening such that the surface of the first epitaxial layer with the super junction is a flat surface.

As a further improvement, in step 1, before performing the photolithography process to define the gate trenches, the method further includes the step of forming a first hard mask layer on the surface of the first epitaxial layer, then firstly etching the first hard mask layer, and then etching the first epitaxial layer to form the gate trenches;

removing the first hard mask layer after the first flattening stops on the first hard mask layer.

As a further improvement, in step 1, after etching the gate trenches and before forming the gate oxide layer, the method further includes the step of performing rounding to the gate trenches, and the rounding includes:

forming a first sacrificial oxide layer by adopting a thermal oxidation process;

removing the first sacrificial oxide layer.

As a further improvement, the gate oxide layer is formed on the side surfaces of the gate trenches by adopting the thermal oxidation process.

As a further improvement, the bottom oxide layer and the gate oxide layer are formed at the same time by adopting the same process; or the thickness of the bottom oxide layer is greater than the thickness of the gate oxide layer, and the bottom oxide layer and the gate oxide layer are formed separately.

As a further improvement, the method further includes the following step: forming a body region by adopting an ion implantation and annealing driving process, and the forming area of the body region is defined through photolithography.

As a further improvement, the forming process of the body region is arranged before step 2.

As a further improvement, the forming process of the body region is arranged before step 1, and before forming the body region, the method further includes the step of performing a photolithography process by adopting a zero layer mask and forming a zero layer alignment mark.

As a further improvement, the forming process of the body region is arranged after step 1.

As a further improvement, the method further includes the following step: forming a source region by adopting an ion implantation and annealing driving process, the forming area of the source region is defined through photolithography, and in the device cell region, the source region is self-aligned with the side surface of the gate structure.

As a further improvement, the forming process of the source region is arranged after step 1 and before step 2; or, the forming process of the source region is arranged after step 2.

As a further improvement, after step 2, the method further includes the following steps:

forming a field oxide, an interlayer film, and contacts, the forming area of the contacts being defined through photolithography, the corresponding contacts being formed at the leading-out position of the gate structure;

then forming a front metal layer, and patterning the front metal layer by adopting a photolithography definition and etching process, an electrode formed by the patterned front metal layer including a gate electrode structure, the gate electrode structure being in contact with the polysilicon gate through the contacts at the leading-out position of the gate structure;

forming a contact pad, the forming area of the contact pad being defined through photolithography;

completing the backside process of the super junction device.

As a further improvement, the field oxide includes a non-slope-climbing flat structure and the interlayer film covers the surface of the flat field oxide;

the interlayer film is formed by adopting a USG oxidation process or TEOS oxidation process.

As a further improvement, in step 2, a second hard mask layer is adopted in the forming process of the super junction, the second hard mask layer is formed by a second bottom oxide layer, a middle nitride layer and a top oxide layer in a stacking manner, and when the second hard mask layer is adopted, the forming process of the super junction includes the following steps:

forming the second hard mask layer;

defining the forming area of the super junction trenches by adopting a photolithography process;

sequentially etching the second hard mask layer and the first epitaxial layer to form the super junction trenches;

removing the top oxide layer of the second hard mask layer, forming a second sacrificial oxide layer by adopting a thermal oxidation process, and then removing the second sacrificial oxide layer;

removing the middle nitride layer of the second hard mask layer;

performing epitaxial filling in the super junction trenches to form the second epitaxial layer;

performing a chemical-mechanical polishing process to the second epitaxial layer to realize the second flattening, such that the second epitaxial layer is only filled in the super junction trenches;

fully removing the second bottom oxide layer of the second hard mask layer or removing part of the thickness.

As a further improvement, the first epitaxial layer is formed on a semiconductor substrate and the backside process of the super junction device includes:

performing back thinning to the semiconductor substrate;

directly using the thinned semiconductor substrate as a drain region, or performing first conducting type heavily-doped back implantation to the thinned semiconductor substrate to form the drain region;

forming a back metal layer on the back surface of the drain region.

As a further improvement, the first flattening is realized by adopting a back etching process or a chemical-mechanical polishing process.

The key of the disclosure is to realize by adopting the all flat process such that the forming process of the gate structure is before the forming process of the super junction. The key to realize the all flat process is that the leading-out of the gate structure is specially arranged, the slope-climbing structure used to lead out the gate is cancelled, and the contacts are directly formed at the leading-out position of the gate structure to connect with the gate electrode structure formed by the front metal layer. Since there is no slope-climbing structure, the gate structure of the disclosure can form a flattened surface, the flattened surface after the formation of the gate structure is the key to form the super junction after the formation of the gate structure, and the formation of the super junction after the forming process of the gate structure can well solve the technical problem of the disclosure, i.e., reduce the mutual diffusion of the impurities of the super junction. In other words, by leading out the gate structure of the super junction device through the contacts in the top of the trench gate, the disclosure can well realize the flattening. After the formation of the gate structure, it can realize the feature of flattening, such that the trench gate process of the disclosure can be conveniently arranged before the forming process of the super junction, flattening can also be conveniently realized after the formation of the super junction, finally the all flat process can be realized and the process difficulty of the device can be greatly reduced. Moreover, arranging the trench gate process before the forming process of the super junction can bring many unexpected technical effects, including the following:

Firstly, the influence of the thermal process in the forming process of the gate structure on the super junction can be eliminated. The thermal process in the forming process of the gate structure mainly includes the forming process of the sacrificial oxide layer and the forming process of the gate oxide layer. The thermal process of the gate structure is relatively large, which can greatly reduce the influence on the mutual diffusion of the PN impurities of the super junction, such that the technical problem of the disclosure can be well solved and finally the performance of the device can be improved.

Secondly, since the forming process of the gate structure is before the forming process of the super junction, it is not necessary to consider the adverse influence of the thermal process on the super junction in the formation of the gate structure, such that the use of the thermal process in the forming process of the gate structure is not restricted, and a gate structure with better quality can be obtained. For example, the temperature of forming the sacrificial oxide layer can be freely set according to the needs when the gate trenches of the trench gate are rounded by adopting the sacrificial oxide layer process.

Thirdly, in the prior art, two times of body region implantation and driving are adopted, and one time of body region implantation and driving is arranged after the formation of the gate structure, so the thermal process of the later body region driving will still have an adverse influence on the super junction. However, by putting the forming process of the gate structure before the forming process of the super junction, the body region implantation and driving process will be performed before the forming process of the super junction, so the disclosure can prevent the adverse influence of the thermal process of the body region driving on the super junction, and can further improve the performance of the device.

Fourthly, since the forming process of the gate structure is put before the forming process of the super junction, the surface of the device cell region is exposed when the gate structure is formed, and the device cell region does not need to be exposed by adopting the formation and etching process of the field oxide. Therefore, the disclosure can save one photolithography definition process of the field oxide, i.e., save one mask related to field oxide etching.

Since it is no longer necessary to remove the field oxide at the top of the device cell region, there is no slope-climbing structure of the field oxide at the edge of the device cell region and the terminal region, and the surface of the entire field oxide is flat. Thus, the interlayer film formed on the field oxide is also a flat structure. Therefore, the BPSG reflow process is not needed to flatten the interlayer film. Therefore, the disclosure can further reduce the adverse influence of the thermal process of the BPSG reflow process on the super junction, and thus can further improve the performance of the device.

In addition, in the disclosure, since the gate structure is formed before the forming process of the super junction, the forming process of the source region, including the implantation and annealing driving process, can also be arranged before the forming process of the super junction. Therefore, the disclosure can further reduce the adverse influence of the thermal process of the source region driving process on the super junction, and thus can further improve the performance of the device.

By arranging the process sequence of the gate structure, the disclosure can not only obtain the beneficial effect related to the reduction of the thermal process of the super junction, but also can save the mask, which will be specifically described as follows:

Firstly, the mask for the photolithography definition process of the field oxide described above can be saved.

Secondly, when the gate structure is formed on the wafer firstly and then the body region is formed, the gate structure can be directly used for alignment in the photolithography of the body region, and the zero layer alignment mark is not needed, so the disclosure can save the zero layer mask.

Thirdly, in the disclosure, the contacts can be formed directly in the top of the leading-out position of the gate structure to lead out the gate structure. It is not necessary to extend the polysilicon gate of the gate structure to the top of the field oxide by climbing a slope, and then form the contacts in the polysilicon at the top of the field oxide to lead out the gate structure. Therefore, it is not necessary to use the photolithography process to perform photolithography definition to the polysilicon climbing on the top of the field oxide. Therefore, the disclosure can further save one mask for the photolithography definition of the polysilicon.

Accordingly, it can be seen that the disclosure can save a plurality of layers of masks, for example, three layers of masks at most, and can greatly decrease the process cost.

BRIEF DESCRIPTION OF THE DRAWINGS

The disclosure will be further described in detail in combination with the specific embodiments with reference to the drawings.

DETAILED DESCRIPTION OF THE DISCLOSURE

Figure 1:
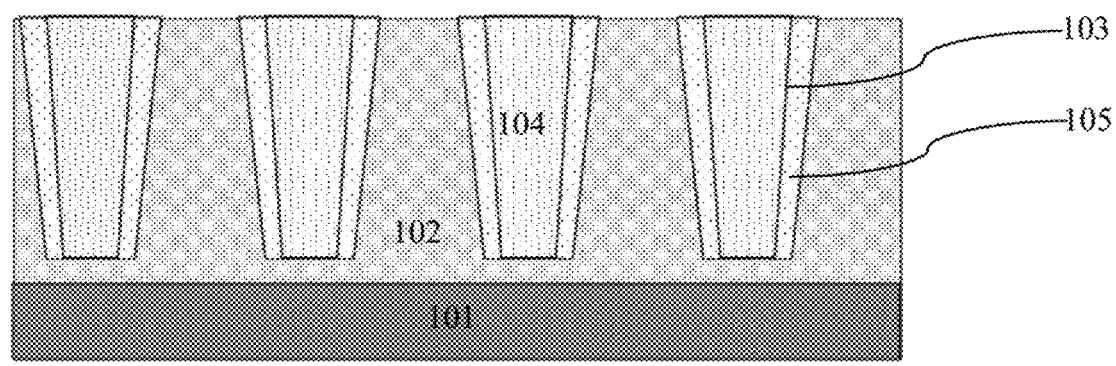
FIG. 1 is a schematic structural view of mutual diffusion of an existing super junction.

The embodiment of the disclosure provides a method for making a super junction device.

In the method for making the super junction device provided by the embodiment of the disclosure, the super junction device includes a super junction. For the structural schematic diagram of the super junction device, please refer to FIG. 4N. In a device cell region, a device front unit structure of the super junction device is formed on the super junction. The device front unit structure includes a gate structure, a second conducting type body region 5, a first conducting type heavily-doped source region 6, a field oxide 8, an interlayer film 9, contacts 10, and a front metal layer 11. The super junction is formed by first conducting type pillars and second conducting type pillars which are arranged alternately, and a super junction unit is formed by a first conducting type pillar and an adjacent second conducting type pillar. First conducting type impurities and second conducting type impurities in each super junction unit have the feature of mutual diffusion under the effect of the thermal process to reduce the net doping concentration of both the first conducting type pillars and the second conducting type pillars. The method for making the super junction device provided by the embodiment of the disclosure is realized by adopting an all flat process, such that the forming process of the gate structure is before the forming process of the super junction, and includes the following steps:

In step 1, the gate structure is formed. The gate structure is a trench gate. The forming process of the trench gate includes the following steps:

A first conducting type first epitaxial layer 2 is provided and a photolithography process is performed to define the forming area of gate trenches 201.

Agate oxide layer 3 is formed on the side surface of the gate trenches 201. A bottom oxide layer is formed on the bottom surface of the gate trenches 201.

The polysilicon gate 4 is filled in the gate trenches 201. The gate oxide 3, the bottom oxide layer and the polysilicon gate 4 formed in the gate trenches 201 form the trench gate.

First flattening is performed such that the surface of the first epitaxial layer 2 with the trench gate is a flat surface.

In the method provided by the embodiment of the disclosure, the first flattening is realized by adopting a back etching process or a chemical-mechanical polishing process.

In step 2, the forming process of the super junction is performed and includes the following steps:

A photolithography process is performed to the flat surface of the first epitaxial layer 2 with the trench gate to define the forming area of super junction trenches 205.

The first epitaxial layer 2 is etched to form the super junction trenches 205.

A second conducting type second epitaxial layer 7 is filled in the super junction trenches 205 and flattening is performed. The second epitaxial layer 7 filled in the super junction trenches 205 forms second conducting type pillars. The first epitaxial layer 2 between the second conducting type pillars forms first conducting type pillars. The first conducting type pillars and the second conducting type pillars are arranged alternately to form the super junction.

Second flattening is performed such that the surface of the first epitaxial layer 2 with the super junction is a flat surface.

The key of the embodiment of the disclosure is to realize by adopting the all flat process such that the forming process of the gate structure is before the forming process of the super junction. The key to realize the all flat process is that the leading-out of the gate structure is specially arranged in the method provided by the embodiment of the disclosure, the slope-climbing structure used to lead out the gate is cancelled, and the contacts are directly formed at the leading-out position of the gate structure to connect with the gate electrode structure formed by the front metal layer. Since there is no slope-climbing structure, the gate structure of the disclosure can form a flattened surface, the flattened surface after the formation of the gate structure is the key to form the super junction after the formation of the gate structure, and the formation of the super junction after the forming process of the gate structure can well solve the technical problem of the disclosure, i.e., reduce the mutual diffusion of the impurities of the super junction. In other words, in the method provided by the embodiment of the disclosure, by leading out the gate structure of the super junction device through the contacts in the top of the trench gate, the disclosure can well realize the flattening. After the formation of the gate structure, it can realize the feature of flattening, such that the trench gate process of the method provided by the embodiment of the disclosure can be conveniently arranged before the forming process of the super junction, flattening can also be conveniently realized after the formation of the super junction, finally the all flat process can be realized and the process difficulty of the device can be greatly reduced. Moreover, arranging the trench gate process before the forming process of the super junction can bring many unexpected technical effects. For example, the influence of the thermal process of the forming process of the gate structure on the super junction can be eliminated, such that the super junction with better quality can be obtained; the rounding process of the gate trenches can be performed at higher temperature, such that the gate structure with better quality can be obtained; the forming process of the gate structure is performed earlier, such that the zero layer mask can be saved usually. The technical effects will be further described in the subsequent embodiments.

Embodiment 1 of the disclosure provides a method for making a super junction device.

Figure 3:
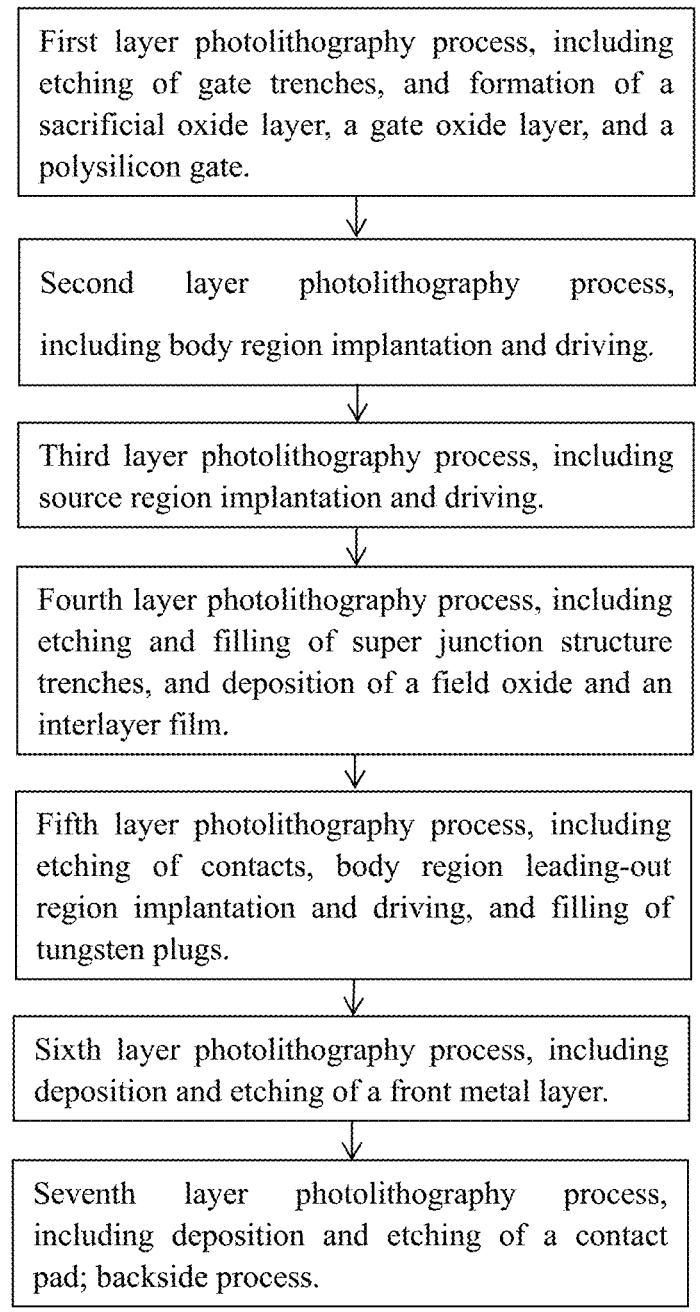
FIG. 3 is a flowchart of a method for making a super junction device according to embodiment 1 of the present invention.
Figure 4A:
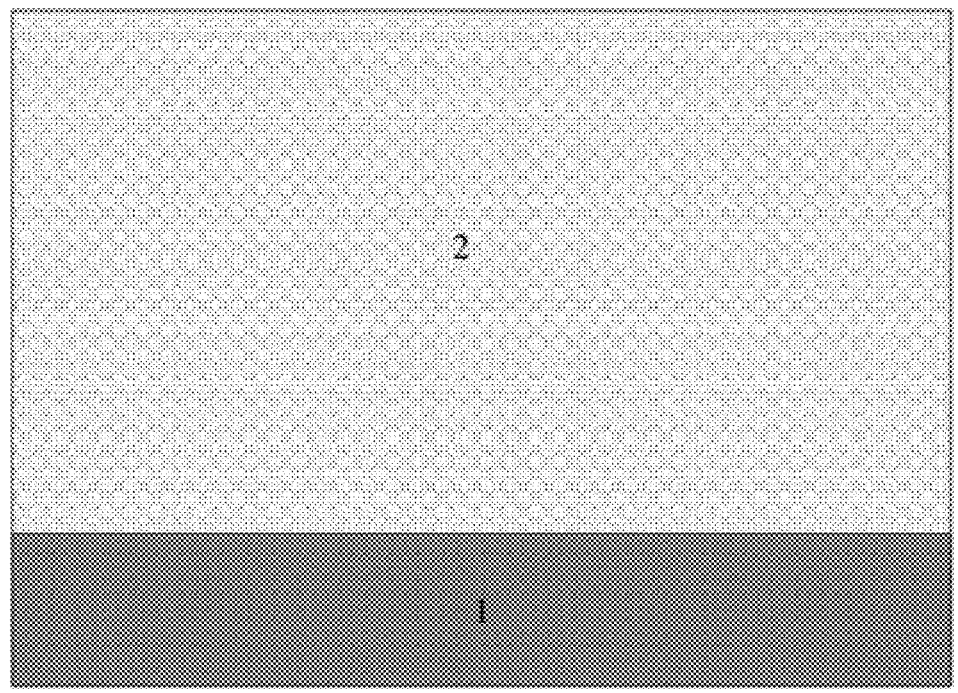
FIG. 4A to FIG. 4N are schematic structural views of a device in each step of the method for the super junction device according to embodiment 1 of the present invention.

Referring to FIG. 3, it is a flowchart of the method for making the super junction device according to embodiment 1 of the disclosure. Steps are illustrated in FIG. 3 according to photolithography process levels. One photolithography process level includes a plurality of specific process steps. The photolithography process corresponding to only one mask is performed at one photolithography process level. Referring to FIG. 4A to FIG. 4N, they are schematic structural views of a device in each step of the method for making the super junction device according to embodiment 1 of the disclosure. The method for making the super junction device according to embodiment 1 of the disclosure includes the following steps:

In step 1, the gate structure is formed. The gate structure is a trench gate. The forming process of the trench gate includes the following steps:

A first conducting type first epitaxial layer 2 is provided and a photolithography process is performed to define the forming area of gate trenches 201.

Referring to FIG. 4A, a first conducting type first epitaxial layer 2 is provided. The first epitaxial layer 2 is formed on the surface of a semiconductor substrate 1, for example, a silicon substrate. A photolithography process is performed to define the forming area of the gate trenches 201.

Figure 4B:
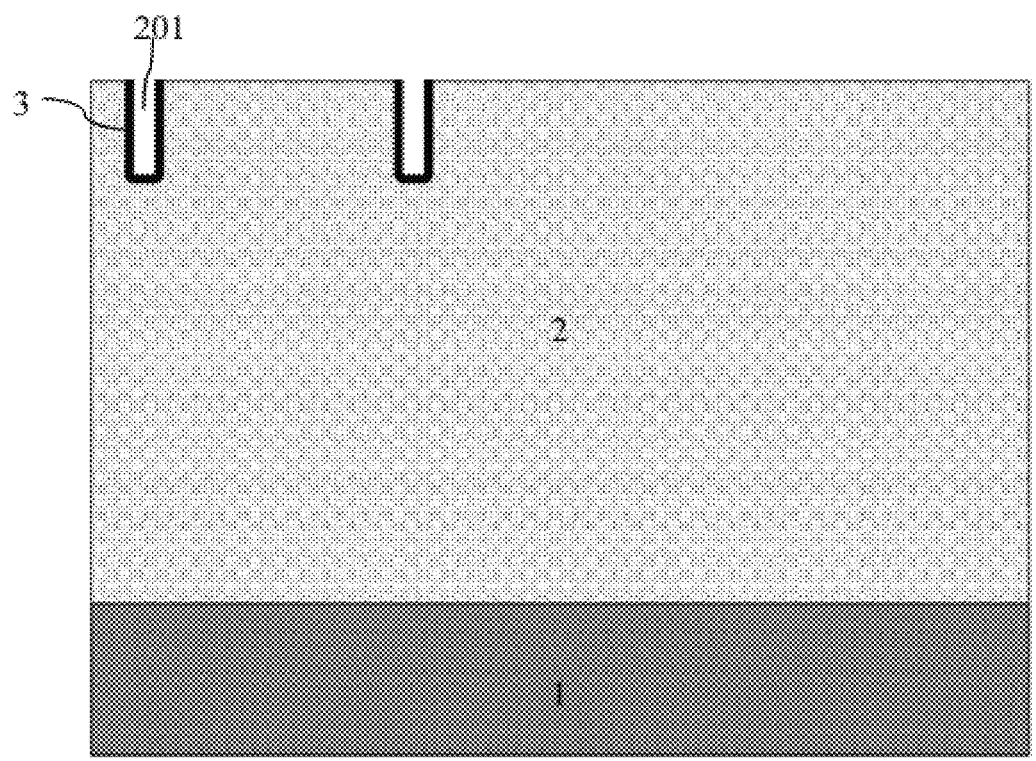

Referring to FIG. 4B, the first epitaxial layer 2 is etched to form the gate trenches 201. The width of the gate trench 201 at the leading-out position of the gate structure satisfies the requirement of forming contacts 10.

Referring to FIG. 4B, a gate oxide layer 3 is formed on the side surfaces of the gate trenches 201, and a bottom oxide layer is formed on the bottom surfaces of the gate trenches 201.

Figure 4C:
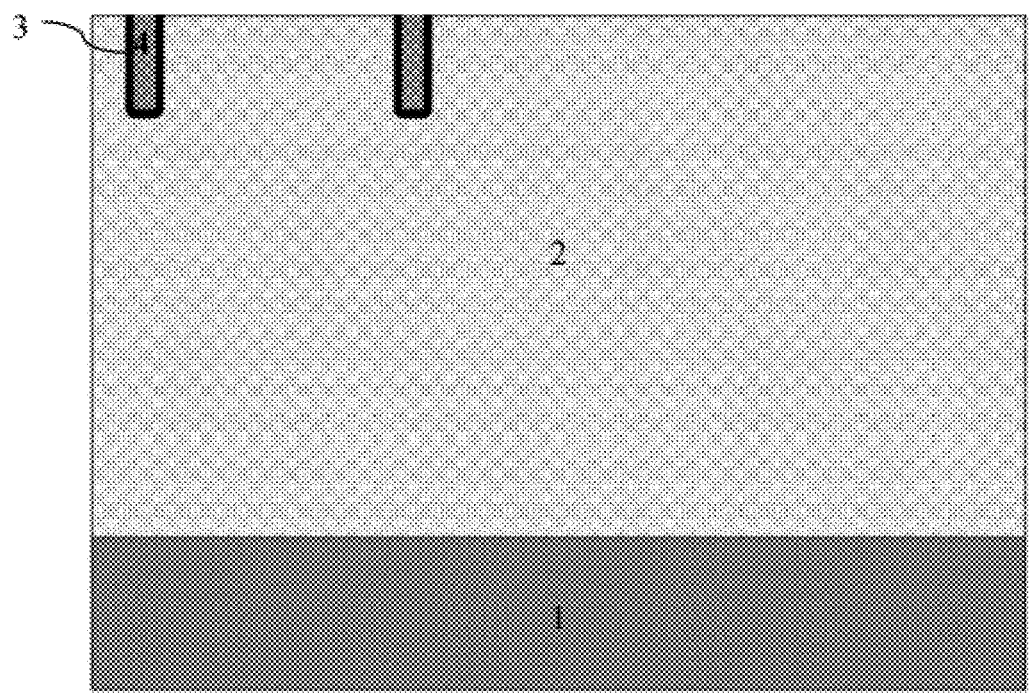

Referring to FIG. 4C, a polysilicon gate 4 is filled in the gate trenches 201. The gate oxide layer 3, the bottom oxide layer and the polysilicon gate 4 formed in the gate trenches 201 form the trench gate.

First flattening is performed such that the surface of the first epitaxial layer 2 with the trench gate is a flat surface.

According to some embodiments, before performing the photolithography process to define the gate trenches 201, the method further includes the step of forming a first hard mask layer on the surface of the first epitaxial layer 2, then firstly etching the first hard mask layer, and then etching the first epitaxial layer 2 to form the gate trenches 201.

The first hard mask layer is removed after the first flattening stops on the first hard mask layer.

The first flattening is realized by adopting a back etching process or a chemical-mechanical polishing process.

In step 1, after etching the gate trenches 201 and before forming the gate oxide layer 3, the method further includes the step of performing rounding to the gate trenches 201, and the rounding includes the following steps:

A first sacrificial oxide layer is formed by adopting a thermal oxidation process.

The first sacrificial oxide layer is removed.

The gate oxide layer 3 is formed on the side surfaces of the gate trenches 201 by adopting the thermal oxidation process.

In embodiment 1 of the disclosure, the bottom oxide layer and the gate oxide layer 3 are formed at the same time by adopting the same thermal oxidation process, so the bottom oxide layer and the gate oxide layer 3 are the same oxide layer with the same thickness, and are marked with reference sign 3. In other embodiments, the thickness of the bottom oxide layer may be greater than the thickness of the gate oxide layer 3, and the bottom oxide layer and the gate oxide layer 3 are formed separately. Generally, the thicker bottom oxide layer is formed firstly, and then the gate oxide layer 3 is formed by adopting the thermal oxidation process. Amorphous ion implantation may be firstly performed to the bottom of the gate trenches 201, and then thermal oxidation is performed to form the bottom oxide layer and the gate oxide layer 3 at the same time. Since the amorphous ion implantation is performed to the bottom of the gate trenches 201, the thermal oxidation speed of the bottom of the gate trenches 201 is accelerated, and the thickness of the bottom oxide layer is greater than the thickness of the gate oxide layer 3. The increase of the thickness of the bottom oxide layer facilitates the improvement of the pressure resistance of the bottom of the gate trenches 201.

The forming process of the trench gate corresponds to the first layer photolithography process in FIG. 3.

Figure 2:
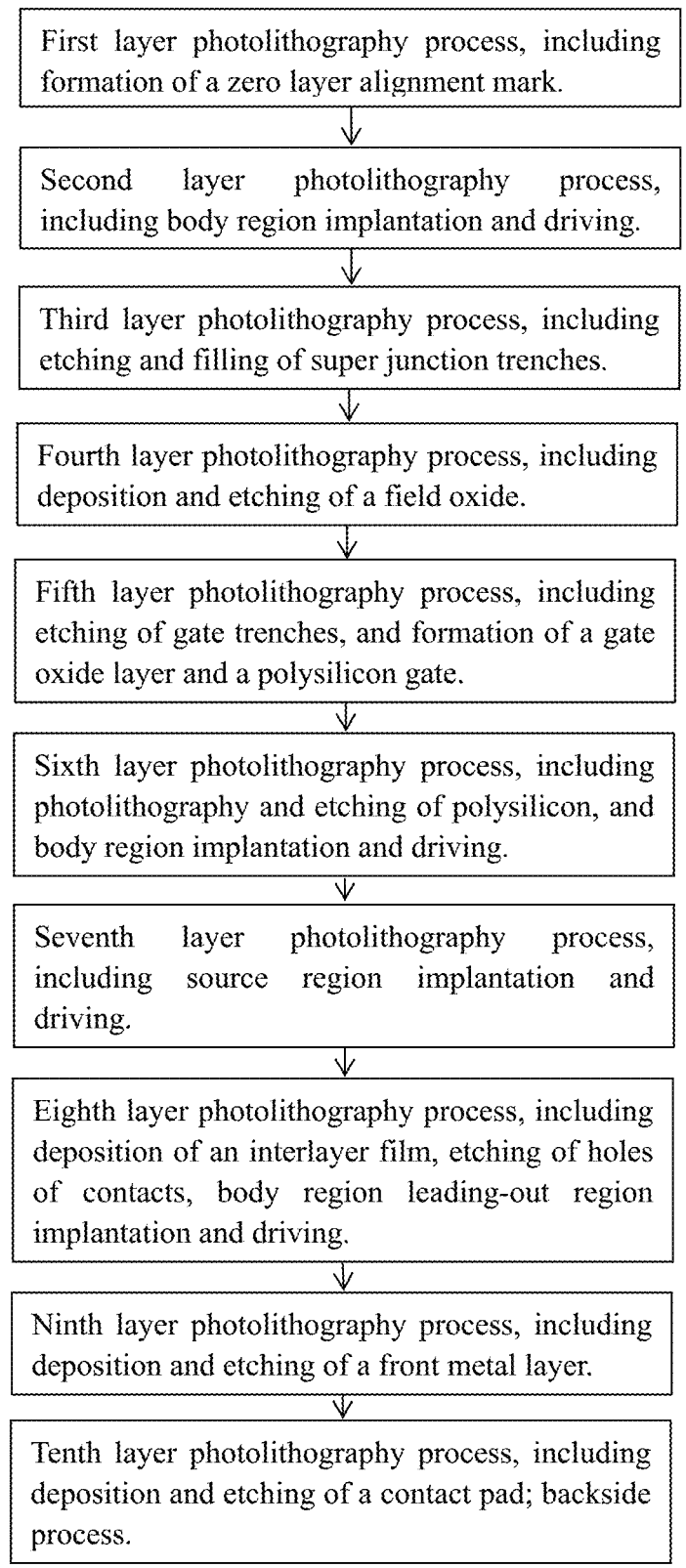
FIG. 2 is a flowchart of an existing method for making a super junction device.
Figure 4D:
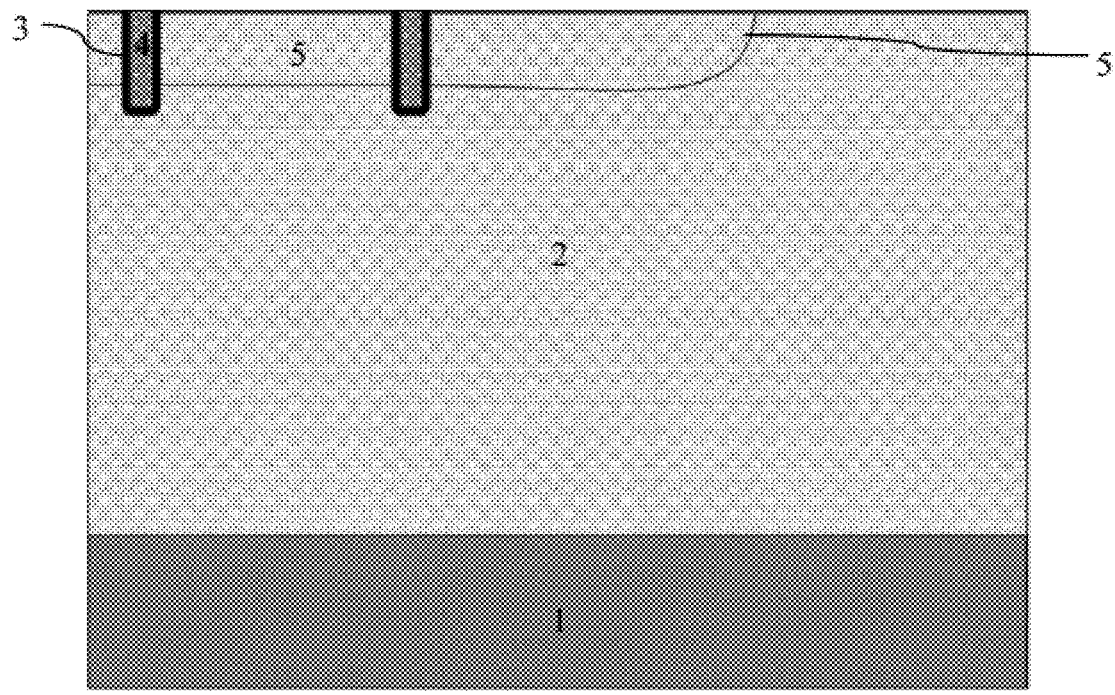

The method further includes the following step: referring to FIG. 4D, a body region 5 is formed by adopting an ion implantation and annealing driving process, and the forming area of the body region 5 is defined through photolithography. The forming step of the body region 5 corresponds to the second layer photolithography process in FIG. 3. Compared with the existing process illustrated in FIG. 2, since the forming process of the gate structure is performed before the forming process of the body region 5 in embodiment 1 of the disclosure, the forming process of the zero layer alignment mark illustrated in FIG. 2 is not needed, such that a layer of mask and the corresponding photolithography process can be saved.

Figure 4E:
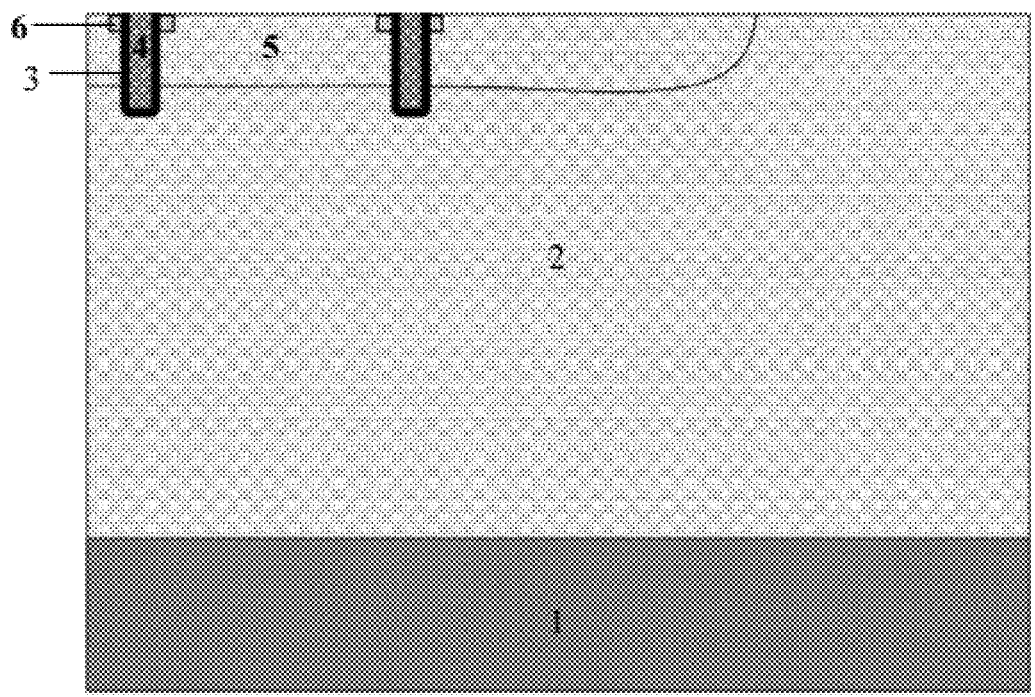

The method further includes the following step: referring to FIG. 4E, a source region 6 is formed by adopting an ion implantation and annealing driving process, the forming area of the source region 6 is defined through photolithography, and in the device cell region, the source region 6 is self-aligned with the side surface of the gate structure. The source region 6 will not be formed in the terminal region, so the source region 6 needs to be defined by adopting a layer of mask, and the forming process of the source region 6 corresponds to the third layer photolithography process in FIG. 3.

Figure 4F:
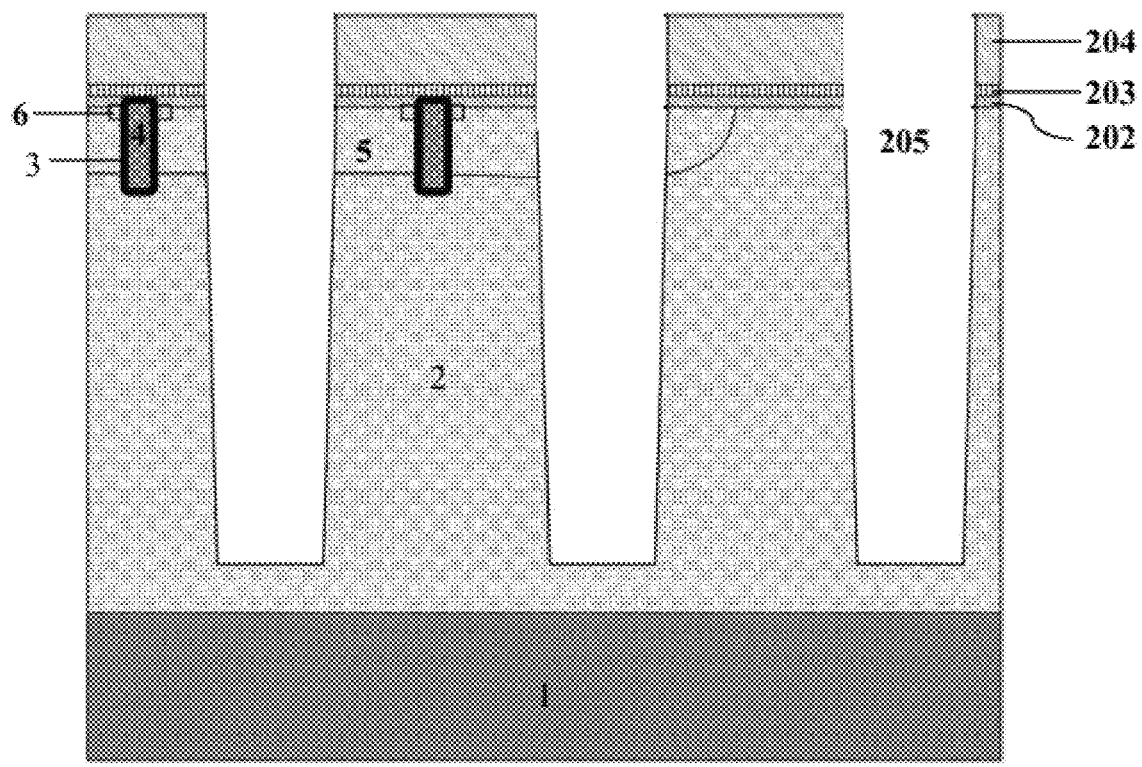

In step 2, the forming process of the super junction is performed and includes the following steps:

Referring to FIG. 4F, a photolithography process is performed to the flat surface of the first epitaxial layer 2 with the trench gate to define the forming area of super junction trenches 205.

Referring to FIG. 4F, the first epitaxial layer 2 is etched to form the super junction trenches 205.

Figure 4G:
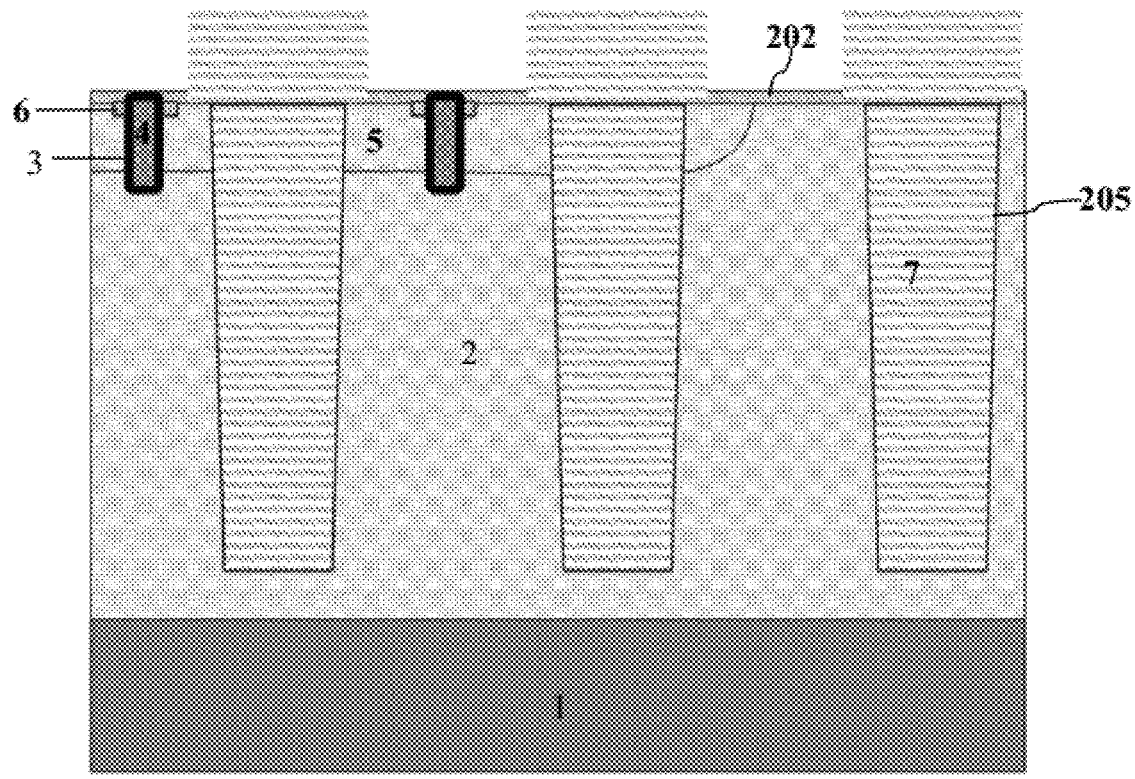

Referring to FIG. 4G, a second conducting type second epitaxial layer 7 is filled in the super junction trenches 205, the second epitaxial layer 7 filled in the super junction trenches 205 forms second conducting type pillars, the first epitaxial layer 2 between the second conducting type pillars forms first conducting type pillars, and the first conducting type pillars and the second conducting type pillars are arranged alternately to form the super junction.

Figure 4H:
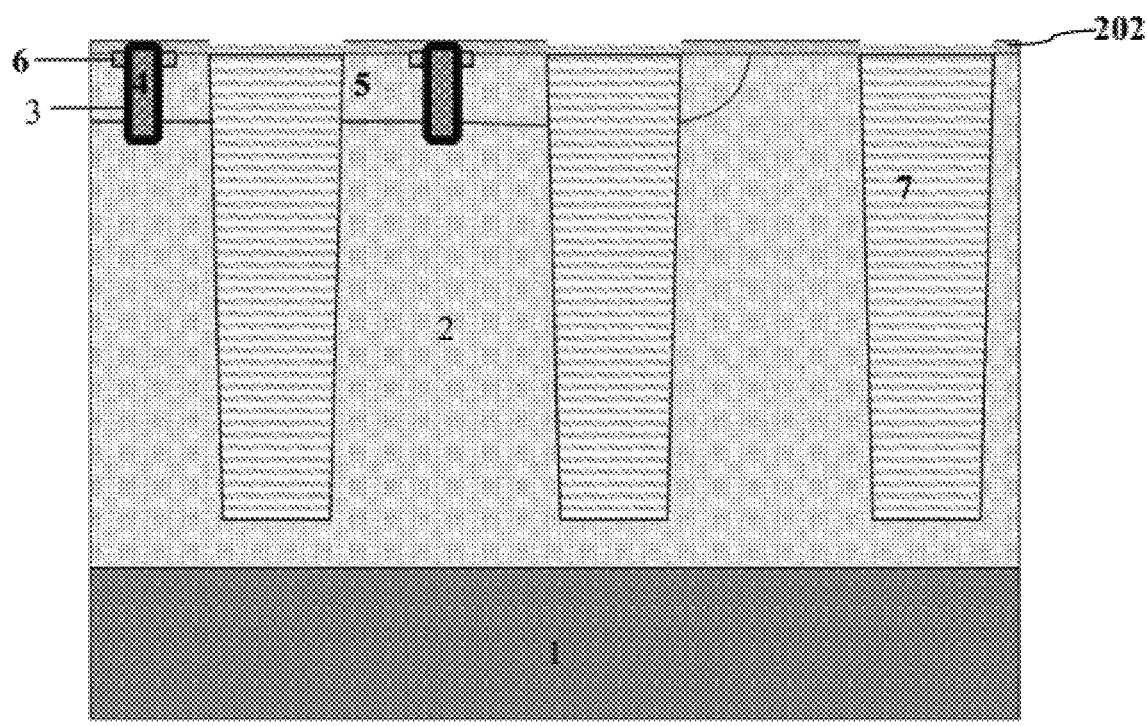

Referring to FIG. 4H, second flattening is performed such that the surface of the first epitaxial layer 2 with the super junction is a flat surface.

According to some embodiments, a second hard mask layer is adopted in the forming process of the super junction, and when the second hard mask layer is adopted, the forming process of the super junction includes the following steps:

Referring to FIG. 4F, the second hard mask layer is formed. The second hard mask layer is formed by a second bottom oxide layer 202, a middle nitride layer 203 and a top oxide layer 204 in a stacking manner.

The forming area of the super junction trenches 205 is defined by adopting a photolithography process.

The second hard mask layer and the first epitaxial layer 2 are sequentially etched to form the super junction trenches 205.

Referring to FIG. 4G, the top oxide layer 204 of the second hard mask layer is removed, a second sacrificial oxide layer is formed by adopting a thermal oxidation process, and then the second sacrificial oxide layer is removed.

Referring to FIG. 4G, the middle nitride layer 203 of the second hard mask layer is removed.

Referring to FIG. 4G, epitaxial filling is performed in the super junction trenches 205 to form the second epitaxial layer 7.

Referring to FIG. 4H, a chemical-mechanical polishing process is performed to the second epitaxial layer 7 to realize the second flattening, such that the second epitaxial layer 7 is only filled in the super junction trenches 205.

The second bottom oxide layer 202 of the second hard mask layer is fully removed or part of the thickness is removed.

Step 2 corresponds to the fourth layer photolithography process in FIG. 3.

Figure 4I:
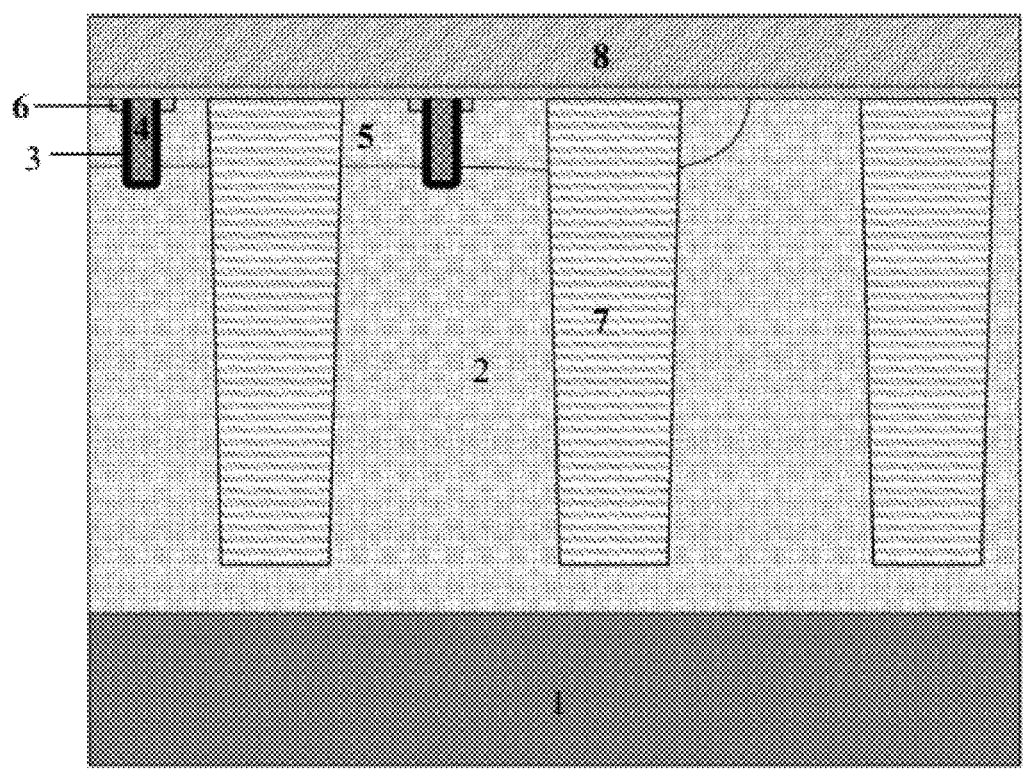

After step 2, the method further includes the following steps:

Referring to FIG. 4I, a field oxide 8 is formed. In embodiment 1 of the disclosure, after the formation of the field oxide 8, it is not necessary to etch the field oxide 8 to open the device cell region, so one mask can be saved in the forming process of the field oxide 8. In FIG. 3, the forming process of the field oxide 8 is still classified into the fourth layer photolithography process in FIG. 3. In addition, the field oxide 8 is not patterned through the photolithography process and the etching process, such that the field oxide 8 includes a non-slope-climbing flat structure.

Figure 4J:
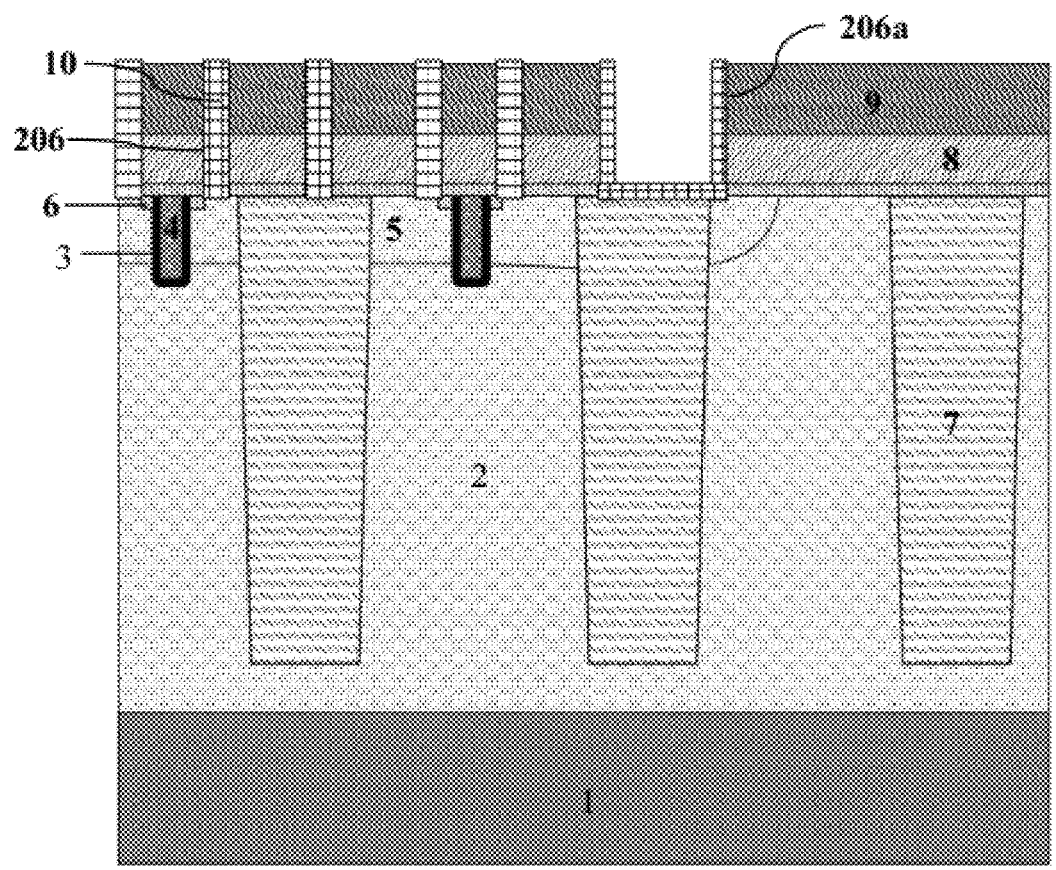

Referring to FIG. 4J, an interlayer film 9 is formed. The interlayer film 9 covers the flat surface of the field oxide 8. Since the field oxide 8 includes a non-slope-climbing flat structure, the BPSG reflow process required for the flattening of the interlayer film 9 is cancelled in the forming process of the interlayer film 9, and the thermal process can be saved by canceling the BPSG reflow process. Since the BPSG reflow process is no longer needed, the interlayer film 9 does not need to be formed by adopting the BPSG oxidation process. In embodiment 1 of the disclosure, the interlayer film 9 is formed by adopting the USG oxidation process or TEOS oxidation process. In FIG. 3, the forming process of the interlayer film 9 is still classified into the fourth layer photolithography process in FIG. 3.

Contacts 10 are formed. The forming area of the contacts 10 is defined through photolithography. The forming process of the contacts 10 includes the following sub-steps:

Referring to FIG. 4J, the forming area of the contacts 10 is defined by adopting a photolithography process, and then the interlayer film 9 and the field oxide 8 are etched sequentially to form openings 206 of the contacts 10.

In FIG. 4J, in the device cell region, the openings 206 are only located in the top of the corresponding source region 6 and the body region 5. An opening 206a with width greater than that of the opening 206 is further formed in the periphery of the device cell region, and the bottom of the opening 206a opens the corresponding second conducting type pillars and the body region 5.

Figure 4K:
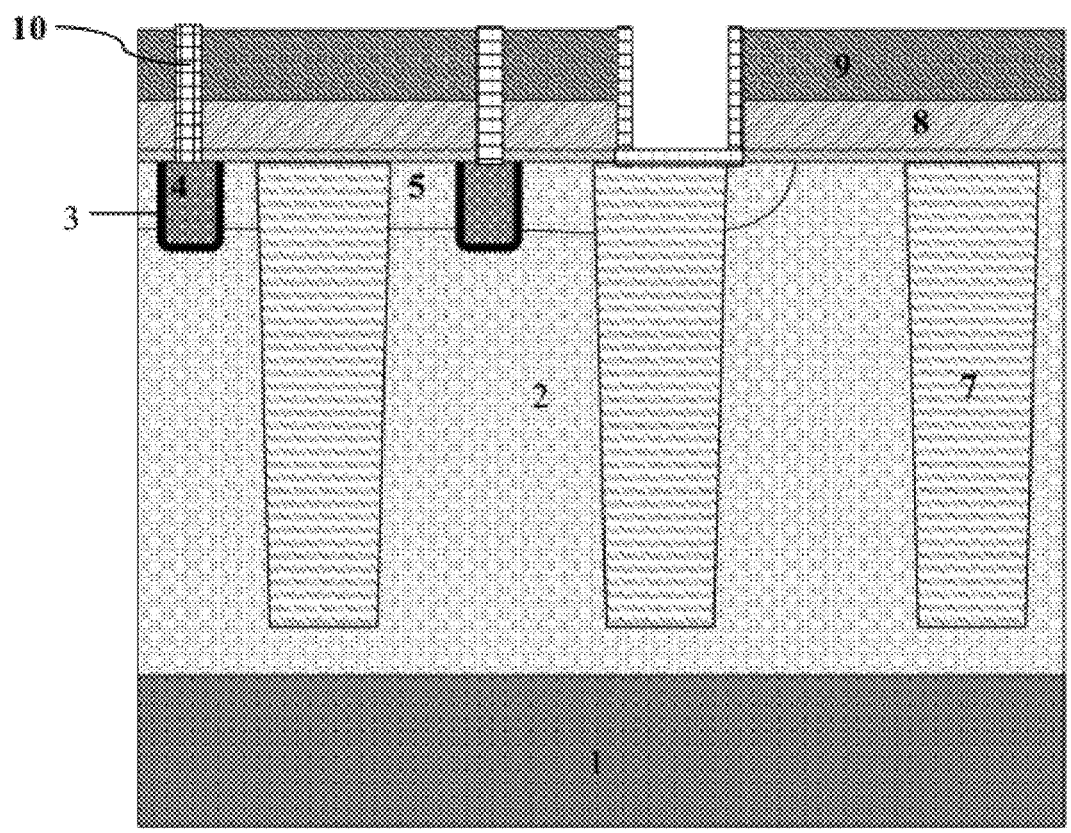

In FIG. 4J, the openings 206 of the contacts 10 are not formed in the top of the polysilicon gate 4 of the gate structure in the device cell region. Referring to FIG. 4K, it illustrates the leading-out position of the gate structure. It can be seen that the width of the gate trench 201 at the leading-out position of the gate structure satisfies the requirement of forming the contacts 10. Therefore, in FIG. 4K, the openings 206 of the contacts 10 are formed in the top of the polysilicon gate 4 at the leading-out position of the gate structure.

Generally, after the openings 206 and the openings 206a are formed, the method further includes the step of performing body region leading-out region implantation of second conducting type heavily-doped ions. The body region leading-out region is implanted into the bottoms of the openings 206 and the opening 206a corresponding to the source region 6 to form a body region leading-out region to realize subsequent Ohmic contact between the contacts 10 and the body region 5.

Then, a metal, for example, tungsten is filled into the openings 206 and the openings 206a to form the contacts 10.

The forming process of the contacts 10 corresponds to the fifth layer photolithography process in FIG. 3.

Figure 4L:
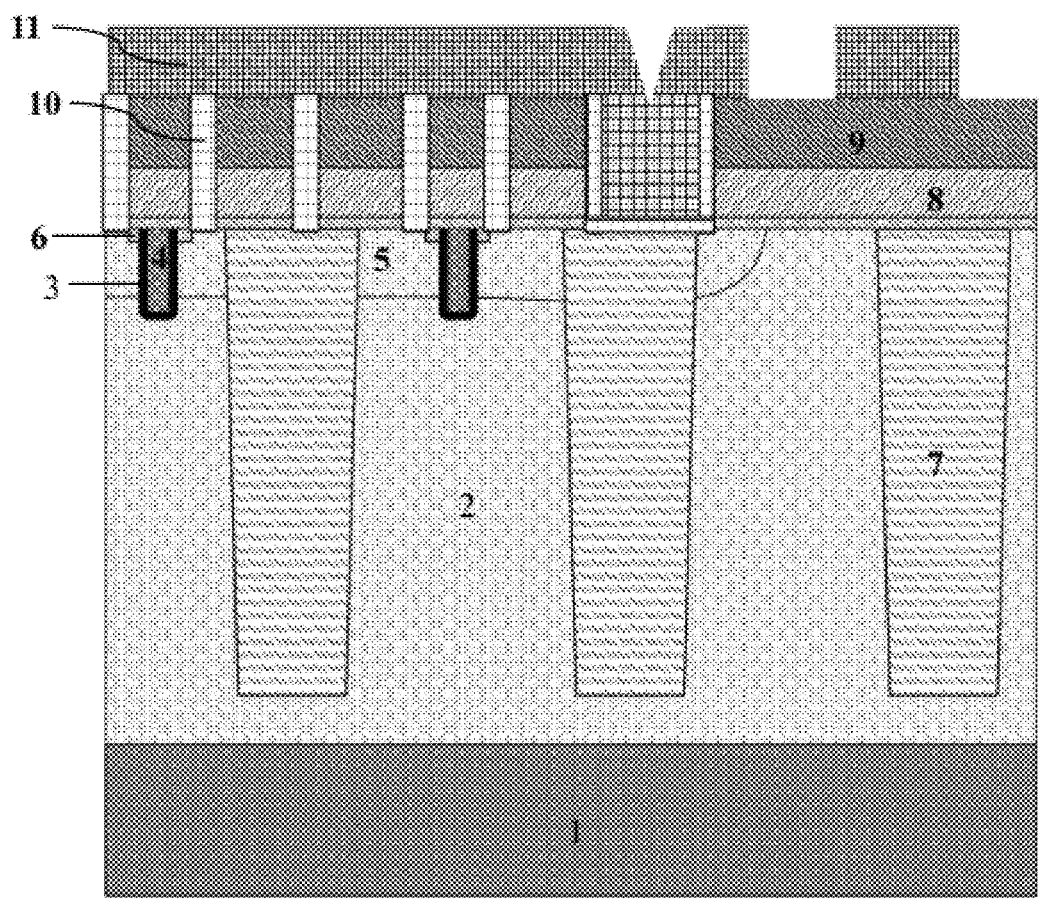

Referring to FIG. 4L, a front metal layer 11 is formed. The front metal layer 11 is patterned by adopting a photolithography definition and etching process. The patterned front metal layer 11 usually forms a source electrode structure connected with the source region 6 and the body region 5, and a gate electrode structure connected with the polysilicon gate 4. The gate electrode structure is in contact with the polysilicon gate 4 through the contacts 10 at the leading-out position of the gate structure.

The forming process of the front metal layer 11 corresponds to the sixth layer photolithography process in FIG. 3.

Figure 4M:
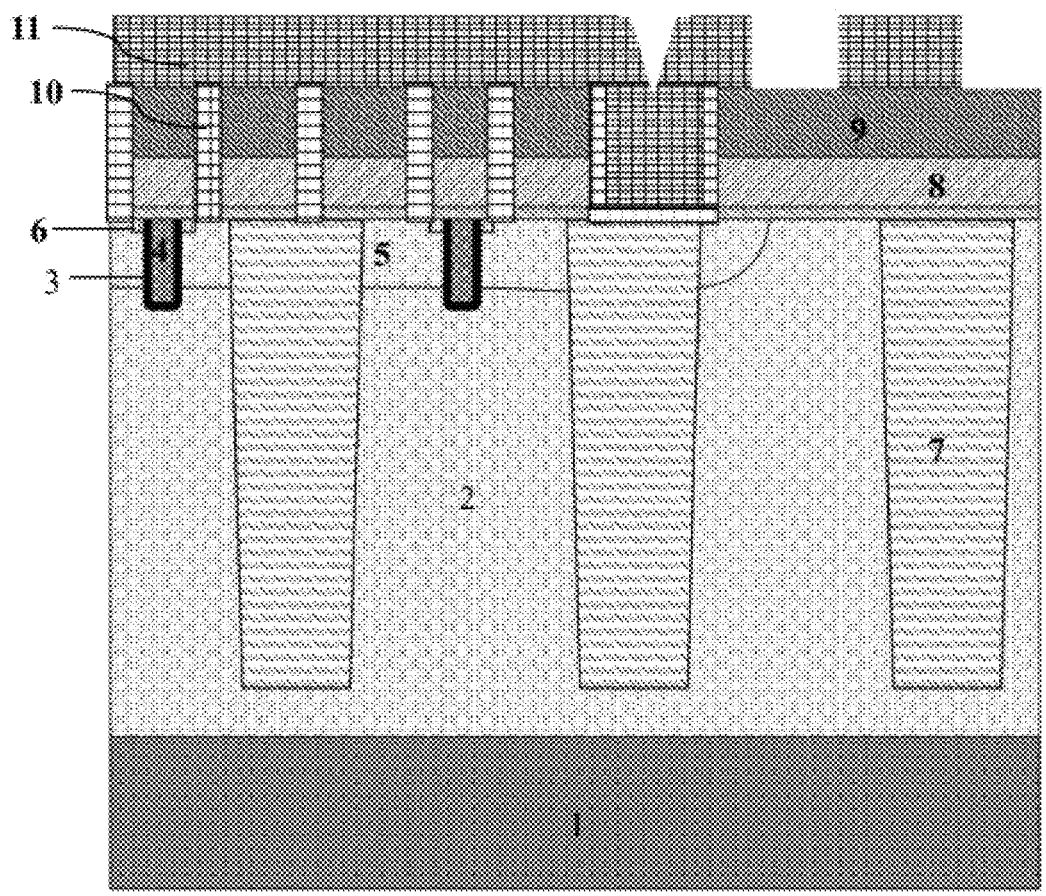
Figure 4N:
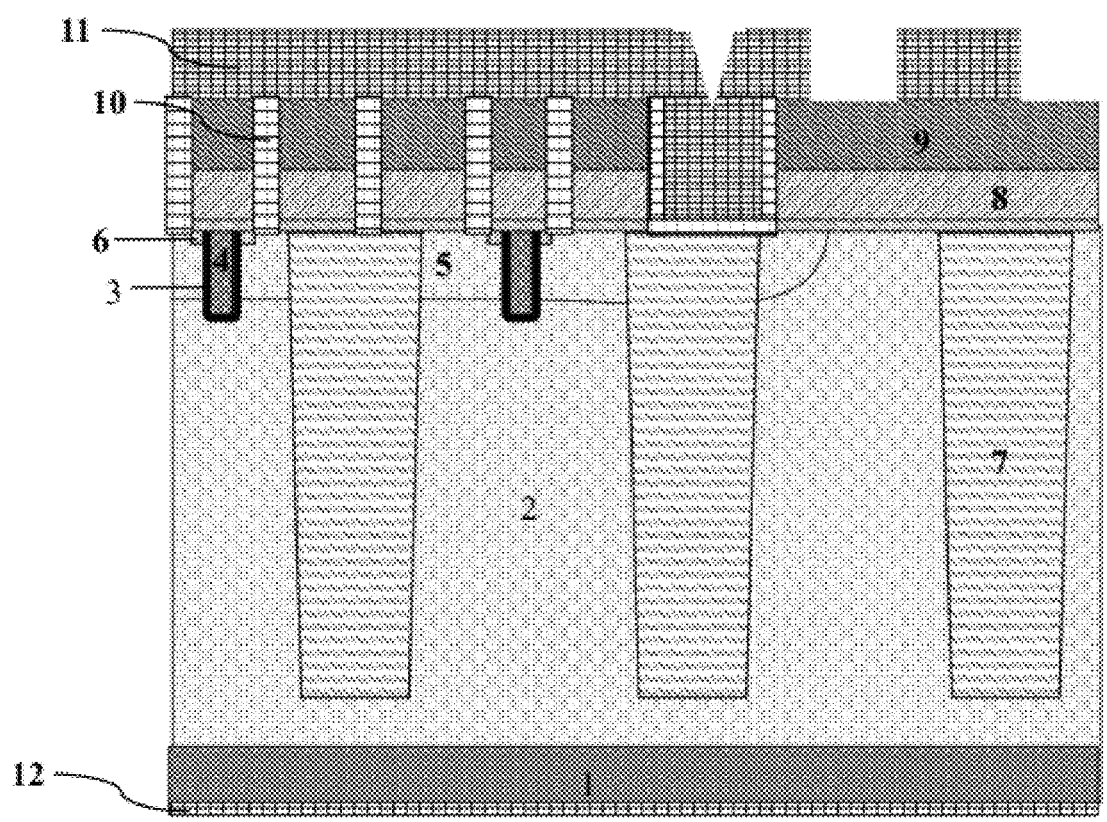

Referring to FIG. 4M, a contact pad is formed. The forming area of the contact pad is defined through photolithography. The contact pad is usually formed by the front metal layer 11 at the topmost layer. The contact pad includes a source electrode pad leading out the source electrode structure and a gate electrode pad leading out the gate electrode structure. The forming process of the contact pad corresponds to the seventh layer photolithography process in FIG. 3.

The backside process of the super junction device is completed. The backside process of the super junction device includes the following steps:

Back thinning is performed to the semiconductor substrate 1.

The thinned semiconductor substrate 1 is directly used as a drain region. In this case, the semiconductor substrate 1 is required to have the feature of first conducting type heavy doping. First conducting type heavily-doped back implantation may also be performed to the thinned semiconductor substrate to form the drain region.

A back metal layer 12 is formed on the back surface of the drain region. In embodiment 1 of the disclosure, the backside process of the super junction device does not need to be defined through photolithography, so the backside process of the super junction device is included in the seventh layer photolithography process in FIG. 3.

In embodiment 1 of the disclosure, the super junction device is an N-type device, the first conducting type is N-type, and the second conducting type is P-type. In other embodiments, the super junction device may be a P-type device, the first conducting type may be P-type, and the second conducting type may be N-type.

In embodiment 1 of the disclosure, by leading out the gate structure of the super junction device through the contacts in the top of the trench gate, the gate structure can be formed by adopting the trench gate process and the flattening can be well realized. After the formation of the gate structure, it can realize the feature of flattening, such that the trench gate process of the disclosure can be conveniently arranged before the forming process of the super junction, flattening can also be conveniently realized after the formation of the super junction, finally the all flat process can be realized and the process difficulty of the device can be greatly reduced. Moreover, arranging the trench gate process before the forming process of the super junction can bring many unexpected technical effects, including the following:

Firstly, the influence of the thermal process in the forming process of the gate structure on the super junction can be eliminated. The thermal process in the forming process of the gate structure mainly includes the forming process of the sacrificial oxide layer and the forming process of the gate oxide layer 3. The thermal process of the gate structure is relatively large, which can greatly reduce the influence on the mutual diffusion of the PN impurities of the super junction, such that the technical problem of the disclosure can be well solved and finally the performance of the device can be improved.

Secondly, since the forming process of the gate structure is before the forming process of the super junction, it is not necessary to consider the adverse influence of the thermal process on the super junction in the formation of the gate structure, such that the use of the thermal process in the forming process of the gate structure is not restricted, and a gate structure with better quality can be obtained. For example, the temperature of forming the sacrificial oxide layer can be freely set according to the needs when the gate trenches 201 of the trench gate are rounded by adopting the sacrificial oxide layer process.

Thirdly, in the prior art, two times of body region 5 implantation and driving will be used, one time of body region 5 implantation and driving is arranged after the formation of the gate structure, so the thermal process of the later body region 5 driving will still have an adverse influence on the super junction. However, in embodiment 1 of the disclosure, by putting the forming process of the gate structure before the forming process of the super junction, the body region 5 implantation and driving process will be performed before the forming process of the super junction, so embodiment 1 of the disclosure can prevent the adverse influence of the thermal process of the body region 5 driving on the super junction, and can further improve the performance of the device.

Fourthly, in embodiment 1 of the disclosure, since the forming process of the gate structure is put before the forming process of the super junction, the surface of the device cell region is exposed when the gate structure is formed, and the device cell region does not need to be exposed by adopting the formation and etching process of the field oxide 8. Therefore, embodiment 1 of the disclosure can save one photolithography definition process of the field oxide 8, i.e., save one mask related to field oxide 8 etching.

Since it is no longer necessary to remove the field oxide 8 at the top of the device cell region, there is no slope-climbing structure of the field oxide 8 at the edge of the device cell region and the terminal region, and the surface of the entire field oxide 8 will be flat. Thus, the interlayer film 9 is a flat structure after the formation of the field oxide 8. Therefore, the BPSG reflow process is not needed to flatten the interlayer film 9. Therefore, embodiment 1 of the disclosure can further reduce the adverse influence of the thermal process of the BPSG reflow process on the super junction, and thus can further improve the performance of the device.

In addition, in embodiment 1 of the disclosure, since the gate structure is formed before the forming process of the super junction, the forming process of the source region 6, including the implantation and annealing driving process, can also be arranged before the forming process of the super junction. Therefore, embodiment 1 of the disclosure can further reduce the adverse influence of the thermal process of the source region 6 driving process on the super junction, and thus can further improve the performance of the device.

By arranging the process sequence of the gate structure, embodiment 1 of the disclosure can not only obtain the beneficial effect related to the reduction of the thermal process of the super junction, but also can save the mask, which will be specifically described as follows:

Firstly, the mask for the photolithography definition process of the field oxide 8 described above can be saved.

Secondly, when the gate structure is formed on the wafer firstly and then the body region 5 is formed, the gate structure can be directly used for alignment in the photolithography of the body region 5, and the zero layer alignment mark is not needed, so the zero layer mask can be saved in embodiment 1 of the disclosure.

Thirdly, in embodiment 1 of the disclosure, contacts 10 can be formed directly in the top of the leading-out position of the gate structure to lead out the gate structure. It is not necessary to extend the polysilicon gate 4 of the gate structure to the top of the field oxide 8 by climbing a slope, and then form contacts 10 in the polysilicon at the top of the field oxide 8 to lead out the gate structure. Therefore, it is not necessary to use the photolithography process to perform photolithography definition to the polysilicon climbing on the top of the field oxide 8. Therefore, one mask for the photolithography definition of the polysilicon can be saved in embodiment 1 of the disclosure.

Accordingly, it can be seen that embodiment 1 of the disclosure can save a plurality of layers of masks, and can greatly decrease the process cost.

Embodiment 2 of the disclosure provides a method for making a super junction device.

Figure 5:
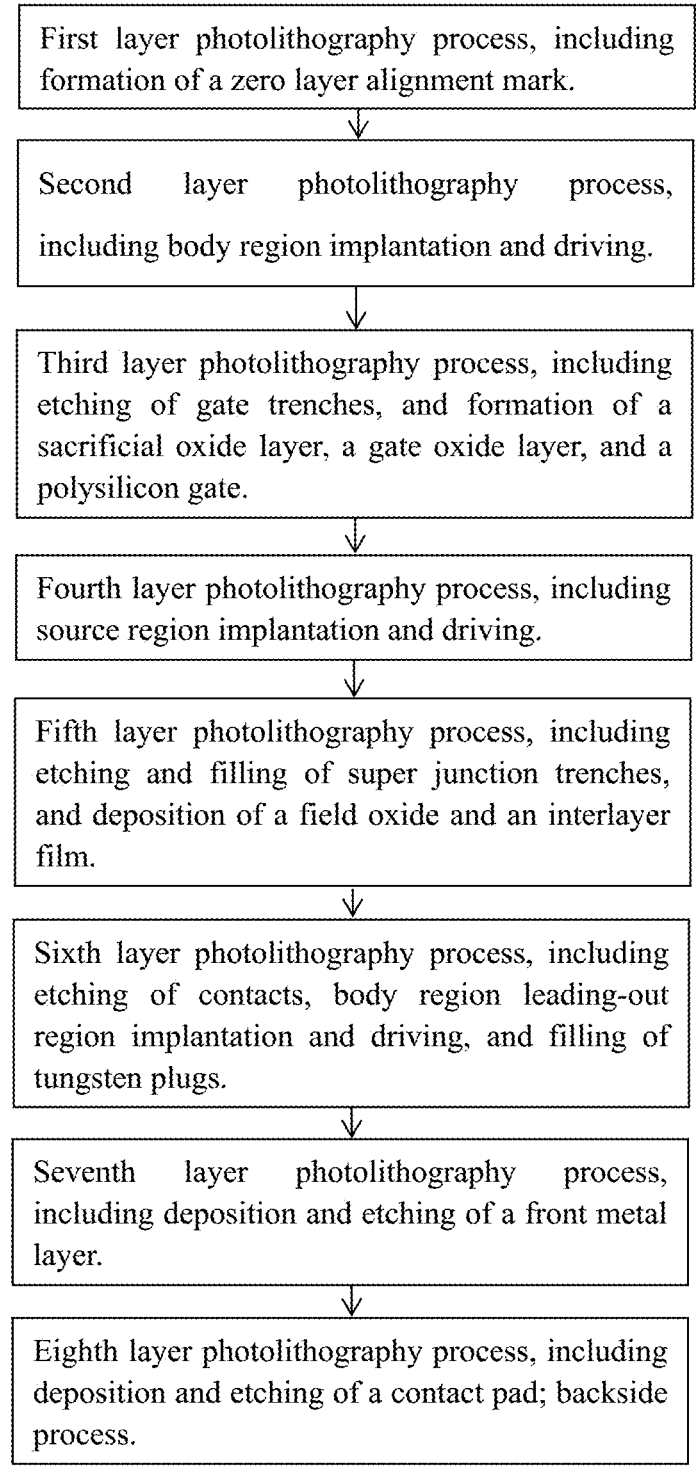
FIG. 5 is a flowchart of a method for making a super junction device according to embodiment 2 of the present invention.

Referring to FIG. 5, it is a flowchart of the method for making the super junction device according to embodiment 2 of the disclosure. For the schematic structural view of the device in each step in the method for making the super junction device according to embodiment 2 of the disclosure, please also refer to FIG. 4A to FIG. 4N. The method for making the super junction device according to embodiment 2 of the disclosure includes the following steps:

Referring to FIG. 4A, a first conducting type first epitaxial layer 2 is provided.

The first epitaxial layer 2 is formed on a semiconductor substrate 1. Generally, the semiconductor substrate 1 is a silicon substrate.

A photolithography process is performed by adopting a zero layer mask and a zero layer alignment mark is formed. The process of forming the zero layer alignment mark corresponds to the first layer photolithography process in FIG. 5.

Referring to FIG. 4D, the forming process of the body region 5 is performed. The forming area of the body region 5 is defined through photolithography. The body region 5 is formed by adopting an ion implantation and annealing driving process. The forming process of the body region 5 corresponds to the second layer photolithography process in FIG. 5.

In step 1, the gate structure is formed. The gate structure is a trench gate. The forming process of the trench gate includes the following steps:

A first conducting type first epitaxial layer 2 is provided and a photolithography process is performed to define the forming area of gate trenches 201.

Referring to FIG. 4A, a first conducting type first epitaxial layer 2 is provided. The first epitaxial layer 2 is formed on the surface of a semiconductor substrate 1, for example, a silicon substrate. A photolithography process is performed to define the forming area of gate trenches 201.

Referring to FIG. 4B, the first epitaxial layer 2 is etched to form the gate trenches 201. The width of the gate trench 201 at the leading-out position of the gate structure satisfies the requirement of forming contacts 10.

Referring to FIG. 4B, a gate oxide layer 3 is formed on the side surfaces of the gate trenches 201, and a bottom oxide layer is formed on the bottom surfaces of the gate trenches 201.

Referring to FIG. 4C, a polysilicon gate 4 is filled in the gate trenches 201. The gate oxide layer 3, the bottom oxide layer and the polysilicon gate 4 formed in the gate trenches 201 form the trench gate.

First flattening is performed such that the surface of the first epitaxial layer 2 with the trench gate is a flat surface.

According to some embodiments, before performing the photolithography process to define the gate trenches 201, the method further includes the step of forming a first hard mask layer on the surface of the first epitaxial layer 2, then firstly etching the first hard mask layer, and then etching the first epitaxial layer 2 to form the gate trenches 201.

The first hard mask layer is removed after the first flattening stops on the first hard mask layer.

The first flattening is realized by adopting a back etching process or a chemical-mechanical polishing process.

In step 1, after etching the gate trenches 201 and before forming the gate oxide layer 3, the method further includes the step of performing rounding to the gate trenches 201, and the rounding includes the following steps:

A first sacrificial oxide layer is formed by adopting a thermal oxidation process.

The first sacrificial oxide layer is removed.

The gate oxide layer 3 is formed on the side surfaces of the gate trenches 201 by adopting the thermal oxidation process.

In embodiment 2 of the disclosure, the bottom oxide layer and the gate oxide layer 3 are formed at the same time by adopting the same thermal oxidation process, so the bottom oxide layer and the gate oxide layer 3 are the same oxide layer with the same thickness, and are marked with reference sign 3. In other embodiments, the thickness of the bottom oxide layer may be greater than the thickness of the gate oxide layer 3, and the bottom oxide layer and the gate oxide layer 3 are formed separately. Generally, the thicker bottom oxide layer is formed firstly, and then the gate oxide layer 3 is formed by adopting the thermal oxidation process. Amorphous ion implantation may be firstly performed to the bottom of the gate trenches 201, and then thermal oxidation is performed to form the bottom oxide layer and the gate oxide layer 3 at the same time. Since the amorphous ion implantation is performed to the bottom of the gate trenches 201, the thermal oxidation speed of the bottom of the gate trenches 201 is accelerated, and the thickness of the bottom oxide layer is greater than the thickness of the gate oxide layer 3. The increase of the thickness of the bottom oxide layer facilitates the improvement of the pressure resistance of the bottom of the gate trenches 201.

The forming process of the trench gate corresponds to the third layer photolithography process in FIG. 5.

The method further includes the following step: referring to FIG. 4E, a source region 6 is formed by adopting an ion implantation and annealing driving process, the forming area of the source region 6 is defined through photolithography, and in the device cell region, the source region 6 is self-aligned with the side surface of the gate structure. The source region 6 will not be formed in the terminal region, so the source region 6 needs to be defined by adopting a layer of mask, and the forming process of the source region 6 corresponds to the fourth layer photolithography process in FIG. 5.

In step 2, the forming process of the super junction is performed and includes the following steps:

Referring to FIG. 4F, a photolithography process is performed to the flat surface of the first epitaxial layer 2 with the trench gate to define the forming area of super junction trenches 205.

Referring to FIG. 4F, the first epitaxial layer 2 is etched to form the super junction trenches 205.

Referring to FIG. 4G, a second conducting type second epitaxial layer 7 is filled in the super junction trenches 205, the second epitaxial layer 7 filled in the super junction trenches 205 forms second conducting type pillars, the first epitaxial layer 2 between the second conducting type pillars forms first conducting type pillars, and the first conducting type pillars and the second conducting type pillars are arranged alternately to form the super junction.

Referring to FIG. 4H, second flattening is performed such that the surface of the first epitaxial layer 2 with the super junction is a flat surface.

According to some embodiments, a second hard mask layer is adopted in the forming process of the super junction, and when the second hard mask layer is adopted, the forming process of the super junction includes the following steps:

Referring to FIG. 4F, the second hard mask layer is formed. The second hard mask layer is formed by a second bottom oxide layer 202, a middle nitride layer 203 and a top oxide layer 204 in a stacking manner.

The forming area of the super junction trenches 205 is defined by adopting a photolithography process.

The second hard mask layer and the first epitaxial layer 2 are sequentially etched to form the super junction trenches 205.

Referring to FIG. 4G, the top oxide layer 204 of the second hard mask layer is removed, a second sacrificial oxide layer is formed by adopting a thermal oxidation process, and then the second sacrificial oxide layer is removed.

Referring to FIG. 4G, the middle nitride layer 203 of the second hard mask layer is removed.

Referring to FIG. 4G, epitaxial filling is performed in the super junction trenches 205 to form the second epitaxial layer 7.

Referring to FIG. 4H, a chemical-mechanical polishing process is performed to the second epitaxial layer 7 to realize the second flattening, such that the second epitaxial layer 7 is only filled in the super junction trenches 205.

The second bottom oxide layer 202 of the second hard mask layer is fully removed or part of the thickness is removed.

Step 2 corresponds to the fifth layer photolithography process in FIG. 5.

After step 2, the method further includes the following steps:

Referring to FIG. 4I, a field oxide 8 is formed. In embodiment 2 of the disclosure, after the formation of the field oxide 8, it is not necessary to etch the field oxide 8 to open the device cell region, so one mask can be saved in the forming process of the field oxide 8. In FIG. 5, the forming process of the field oxide 8 is still classified into the fifth layer photolithography process in FIG. 5. In addition, the field oxide 8 is not patterned through the photolithography process and the etching process, such that the field oxide 8 includes a non-slope-climbing flat structure.

Referring to FIG. 4J, an interlayer film 9 is formed. The interlayer film 9 covers the flat surface of the field oxide 8. Since the field oxide 8 includes a non-slope-climbing flat structure, the BPSG reflow process required for the flattening of the interlayer film 9 is cancelled in the forming process of the interlayer film 9, and the thermal process can be saved by canceling the BPSG reflow process. Since the BPSG reflow process is no longer needed, the interlayer film 9 does not need to be formed by adopting the BPSG oxidation process. In embodiment 2 of the disclosure, the interlayer film 9 is formed by adopting the USG oxidation process or TEOS oxidation process. In FIG. 5, the forming process of the interlayer film 9 is still classified into the fifth layer photolithography process in FIG. 5.

Contacts 10 are formed. The forming area of the contacts 10 is defined through photolithography. The forming process of the contacts 10 includes the following sub-steps:

Referring to FIG. 4J, the forming area of the contacts 10 is defined by adopting a photolithography process, and then the interlayer film 9 and the field oxide 8 are etched sequentially to form openings 206 of the contacts 10.

In FIG. 4J, in the device cell region, the openings 206 are only located in the top of the corresponding source region 6 and the body region 5. An opening 206a with width greater than that of the opening 206 is further formed in the periphery of the device cell region, and the bottom of the opening 206a opens the corresponding second conducting type pillars and the body region 5.

In FIG. 4J, the openings 206 of the contacts 10 are not formed in the top of the polysilicon gate 4 of the gate structure in the device cell region. Referring to FIG. 4K, it illustrates the leading-out position of the gate structure. It can be seen that the width of the gate trench 201 at the leading-out position of the gate structure satisfies the requirement of forming the contacts 10. Therefore, in FIG. 4K, the openings 206 of the contacts 10 are formed in the top of the polysilicon gate 4 at the leading-out position of the gate structure.

Generally, after the openings 206 and the openings 206a are formed, the method further includes the step of performing body region leading-out region implantation of second conducting type heavily-doped ions. The body region leading-out region is implanted into the bottoms of the openings 206 and the opening 206a corresponding to the source region 6 to form a body region leading-out region to realize subsequent Ohmic contact between the contacts 10 and the body region 5.

Then, a metal, for example, tungsten is filled into the openings 206 and the openings 206a to form the contacts 10.

The forming process of the contacts 10 corresponds to the sixth layer photolithography process in FIG. 5.

Referring to FIG. 4L, a front metal layer 11 is formed. The front metal layer 11 is patterned by adopting a photolithography definition and etching process. The patterned front metal layer 11 usually forms a source electrode structure connected with the source region 6 and the body region 5, and a gate electrode structure connected with the polysilicon gate 4. The gate electrode structure is in contact with the polysilicon gate 4 through the contacts 10 at the leading-out position of the gate structure. The forming process of the front metal layer 11 corresponds to the seventh layer photolithography process in FIG. 5.

Referring to FIG. 4M, a contact pad is formed. The forming area of the contact pad is defined through photolithography. The contact pad is usually formed by the front metal layer 11 at the topmost layer. The contact pad includes a source electrode pad leading out the source electrode structure and a gate electrode pad leading out the gate electrode structure. The forming process of the contact pad corresponds to the eighth layer photolithography process in FIG. 5.

The backside process of the super junction device is completed. The backside process of the super junction device includes the following steps:

Back thinning is performed to the semiconductor substrate 1.

The thinned semiconductor substrate 1 is directly used as a drain region. In this case, the semiconductor substrate 1 is required to have the feature of first conducting type heavy doping. First conducting type heavily-doped back implantation may also be performed to the thinned semiconductor substrate to form the drain region.

A back metal layer 12 is formed on the back surface of the drain region. In embodiment 2 of the disclosure, the backside process of the super junction device does not need to be defined through photolithography, so the backside process of the super junction device is included in the eighth layer photolithography process in FIG. 5.

In embodiment 2 of the disclosure, the super junction device is an N-type device, the first conducting type is N-type, and the second conducting type is P-type. In other embodiments, the super junction device may be a P-type device, the first conducting type may be P-type, and the second conducting type may be N-type.

Compared with embodiment 1 of the disclosure, in embodiment 2 of the disclosure, only the sequence of the forming process of the gate structure and the sequence of the forming process of the body region 5 are exchanged, and a corresponding photolithography process for forming a zero layer alignment mark is added. Embodiment 2 of the disclosure can still well reduce the thermal processes of the super junction.

Embodiment 3 of the disclosure provides a method for making a super junction device.

Figure 6:
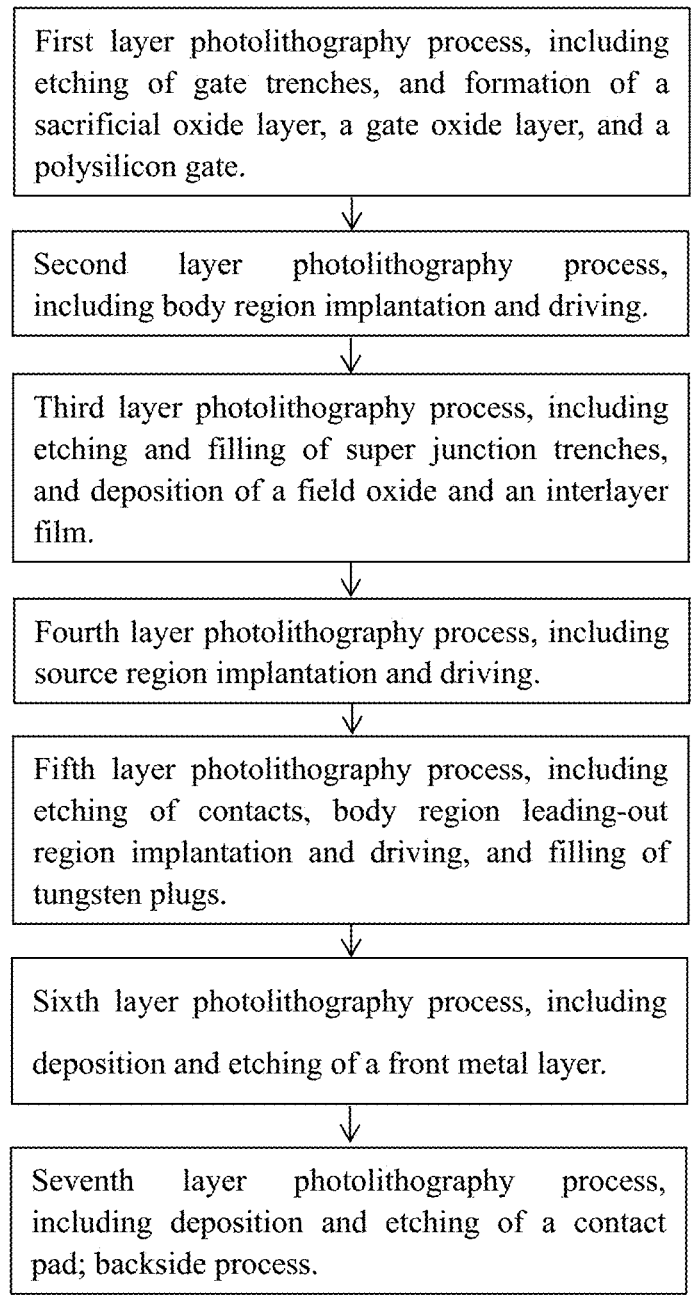
FIG. 6 is a flowchart of a method for making a super junction device according to embodiment 3 of the present invention.

Referring to FIG. 6, it is a flowchart of the method for making the super junction device according to embodiment 3 of the disclosure. For the schematic structural view of the device in each step in the method for making the super junction device according to embodiment 3 of the disclosure, please also refer to FIG. 4A to FIG. 4N. The method for making the super junction device according to embodiment 3 of the disclosure includes the following steps:

In step 1, the gate structure is formed. The gate structure is a trench gate. The forming process of the trench gate includes the following steps:

A first conducting type first epitaxial layer 2 is provided and a photolithography process is performed to define the forming area of gate trenches 201.

Referring to FIG. 4A, a first conducting type first epitaxial layer 2 is provided. The first epitaxial layer 2 is formed on the surface of a semiconductor substrate 1, for example, a silicon substrate. A photolithography process is performed to define the forming area of gate trenches 201.

Referring to FIG. 4B, the first epitaxial layer 2 is etched to form the gate trenches 201. The width of the gate trench 201 at the leading-out position of the gate structure satisfies the requirement of forming contacts 10.

Referring to FIG. 4B, a gate oxide layer 3 is formed on the side surfaces of the gate trenches 201, and a bottom oxide layer is formed on the bottom surfaces of the gate trenches 201.

Referring to FIG. 4C, a polysilicon gate 4 is filled in the gate trenches 201. The gate oxide layer 3, the bottom oxide layer and the polysilicon gate 4 formed in the gate trenches 201 form the trench gate.

First flattening is performed such that the surface of the first epitaxial layer 2 with the trench gate is a flat surface.

According to some embodiments, before performing the photolithography process to define the gate trenches 201, the method further includes the step of forming a first hard mask layer on the surface of the first epitaxial layer 2, then firstly etching the first hard mask layer, and then etching the first epitaxial layer 2 to form the gate trenches 201.

The first hard mask layer is removed after the first flattening stops on the first hard mask layer.

The first flattening is realized by adopting a back etching process or a chemical-mechanical polishing process.

In step 1, after etching the gate trenches 201 and before forming the gate oxide layer 3, the method further includes the step of performing rounding to the gate trenches 201, and the rounding includes the following steps:

A first sacrificial oxide layer is formed by adopting a thermal oxidation process.

The first sacrificial oxide layer is removed.

The gate oxide layer 3 is formed on the side surfaces of the gate trenches 201 by adopting the thermal oxidation process.

In embodiment 3 of the disclosure, the bottom oxide layer and the gate oxide layer 3 are formed at the same time by adopting the same thermal oxidation process, so the bottom oxide layer and the gate oxide layer 3 are the same oxide layer with the same thickness, and are marked with reference sign 3. In other embodiments, the thickness of the bottom oxide layer may be greater than the thickness of the gate oxide layer 3, and the bottom oxide layer and the gate oxide layer 3 are formed separately. Generally, the thicker bottom oxide layer is formed firstly, and then the gate oxide layer 3 is formed by adopting the thermal oxidation process. Amorphous ion implantation may be firstly performed to the bottom of the gate trenches 201, and then thermal oxidation is performed to form the bottom oxide layer and the gate oxide layer 3 at the same time. Since the amorphous ion implantation is performed to the bottom of the gate trenches 201, the thermal oxidation speed of the bottom of the gate trenches 201 is accelerated, and the thickness of the bottom oxide layer is greater than the thickness of the gate oxide layer 3. The increase of the thickness of the bottom oxide layer facilitates the improvement of the pressure resistance of the bottom of the gate trenches 201.

The forming process of the trench gate corresponds to the first layer photolithography process in FIG. 6.

The method further includes the following step: referring to FIG. 4D, a body region 5 is formed by adopting an ion implantation and annealing driving process, and the forming area of the body region 5 is defined through photolithography. The forming step of the body region 5 corresponds to the second layer photolithography process in FIG. 6. Compared with the existing process illustrated in FIG. 2, since the forming process of the gate structure is performed before the forming process of the body region 5 in embodiment 3 of the disclosure, the forming process of the zero layer alignment mark illustrated in FIG. 2 is not needed, such that a layer of mask and the corresponding photolithography process can be saved.

In step 2, the forming process of the super junction is performed and includes the following steps:

Referring to FIG. 4F, a photolithography process is performed to the flat surface of the first epitaxial layer 2 with the trench gate to define the forming area of super junction trenches 205.

Referring to FIG. 4F, the first epitaxial layer 2 is etched to form the super junction trenches 205.

Referring to FIG. 4G, a second conducting type second epitaxial layer 7 is filled in the super junction trenches 205, the second epitaxial layer 7 filled in the super junction trenches 205 forms second conducting type pillars, the first epitaxial layer 2 between the second conducting type pillars forms first conducting type pillars, and the first conducting type pillars and the second conducting type pillars are arranged alternately to form the super junction.

Referring to FIG. 4H, second flattening is performed such that the surface of the first epitaxial layer 2 with the super junction is a flat surface.

According to some embodiments, a second hard mask layer is adopted in the forming process of the super junction, and when the second hard mask layer is adopted, the forming process of the super junction includes the following steps:

Referring to FIG. 4F, the second hard mask layer is formed. The second hard mask layer is formed by a second bottom oxide layer 202, a middle nitride layer 203 and a top oxide layer 204 in a stacking manner.

The forming area of the super junction trenches 205 is defined by adopting a photolithography process.

The second hard mask layer and the first epitaxial layer 2 are sequentially etched to form the super junction trenches 205.

Referring to FIG. 4G, the top oxide layer 204 of the second hard mask layer is removed, a second sacrificial oxide layer is formed by adopting a thermal oxidation process, and then the second sacrificial oxide layer is removed.

Referring to FIG. 4G, the middle nitride layer 203 of the second hard mask layer is removed.

Referring to FIG. 4G, epitaxial filling is performed in the super junction trenches 205 to form the second epitaxial layer 7.

Referring to FIG. 4H, a chemical-mechanical polishing process is performed to the second epitaxial layer 7 to realize the second flattening, such that the second epitaxial layer 7 is only filled in the super junction trenches 205.

The second bottom oxide layer 202 of the second hard mask layer is fully removed or part of the thickness is removed.

Step 2 corresponds to the third layer photolithography process in FIG. 6.

After step 2, the method further includes the following steps:

Referring to FIG. 4E, the forming process of a source region 6 is performed. The forming area of the source region 6 is defined through photolithography. The source region 6 is formed by adopting an ion implantation and annealing driving process. In the device cell region, the source region 6 is self-aligned with the side surface of the corresponding gate structure.

The source region 6 is not formed in the terminal region, so the source region 6 needs to be defined by adopting a layer of mask, and the forming process of the source region 6 corresponds to the fourth layer photolithography process in FIG. 6.

Compared with embodiment 1 of the disclosure, in embodiment 3 of the disclosure, only the sequence of the forming process of the source region 6 and the sequence of the forming process of the super junction are exchanged.

Referring to FIG. 4I, a field oxide 8 is formed. In embodiment 3 of the disclosure, after the formation of the field oxide 8, it is not necessary to etch the field oxide 8 to open the device cell region, so one mask can be saved in the forming process of the field oxide 8. In FIG. 6, the forming process of the field oxide 8 is still classified into the third layer photolithography process in FIG. 6. In addition, the field oxide 8 is not patterned through the photolithography process and the etching process, such that the field oxide 8 includes a non-slope-climbing flat structure.

Referring to FIG. 4J, an interlayer film 9 is formed. The interlayer film 9 covers the flat surface of the field oxide 8. Since the field oxide 8 includes a non-slope-climbing flat structure, the BPSG reflow process required for the flattening of the interlayer film 9 is cancelled in the forming process of the interlayer film 9, and the thermal process can be saved by canceling the BPSG reflow process. Since the BPSG reflow process is no longer needed, the interlayer film 9 does not need to be formed by adopting the BPSG oxidation process. In embodiment 3 of the disclosure, the interlayer film 9 is formed by adopting the USG oxidation process or TEOS oxidation process. In FIG. 6, the forming process of the interlayer film 9 is still classified into the third layer photolithography process in FIG. 6.

Contacts 10 are formed. The forming area of the contacts 10 is defined through photolithography. The forming process of the contacts 10 includes the following sub-steps:

Referring to FIG. 4J, the forming area of the contacts 10 is defined by adopting a photolithography process, and then the interlayer film 9 and the field oxide 8 are etched sequentially to form openings 206 of the contacts 10.

In FIG. 4J, in the device cell region, the openings 206 are only located in the top of the corresponding source region 6 and the body region 5. An opening 206a with width greater than that of the opening 206 is further formed in the periphery of the device cell region, and the bottom of the opening 206a opens the corresponding second conducting type pillars and the body region 5.

In FIG. 4J, the openings 206 of the contacts 10 are not formed in the top of the polysilicon gate 4 of the gate structure in the device cell region. Referring to FIG. 4K, it illustrates the leading-out position of the gate structure. It can be seen that the width of the gate trench 201 at the leading-out position of the gate structure satisfies the requirement of forming the contacts 10. Therefore, in FIG. 4K, the openings 206 of the contacts 10 are formed in the top of the polysilicon gate 4 at the leading-out position of the gate structure.

Generally, after the openings 206 and the openings 206a are formed, the method further includes the step of performing body region leading-out region implantation of second conducting type heavily-doped ions. The body region leading-out region is implanted into the bottoms of the openings 206 and the opening 206a corresponding to the source region 6 to form a body region leading-out region to realize subsequent Ohmic contact between the contacts 10 and the body region 5.

Then, a metal, for example, tungsten is filled into the openings 206 and the openings 206a to form the contacts 10.

The forming process of the contacts 10 corresponds to the fifth layer photolithography process in FIG. 6.

Referring to FIG. 4L, a front metal layer 11 is formed. The front metal layer 11 is patterned by adopting a photolithography definition and etching process. The patterned front metal layer 11 usually forms a source electrode structure connected with the source region 6 and the body region 5, and a gate electrode structure connected with the polysilicon gate 4. The gate electrode structure is in contact with the polysilicon gate 4 through the contacts 10 at the leading-out position of the gate structure. The forming process of the front metal layer 11 corresponds to the sixth layer photolithography process in FIG. 6.

Referring to FIG. 4M, a contact pad is formed. The forming area of the contact pad is defined through photolithography. The contact pad is usually formed by the front metal layer 11 at the topmost layer. The contact pad includes a source electrode pad leading out the source electrode structure and a gate electrode pad leading out the gate electrode structure. The forming process of the contact pad corresponds to the sixth layer photolithography process in FIG. 6.

The backside process of the super junction device is completed. The backside process of the super junction device includes the following steps:

Back thinning is performed to the semiconductor substrate 1.

The thinned semiconductor substrate 1 is directly used as a drain region. In this case, the semiconductor substrate 1 is required to have the feature of first conducting type heavy doping. First conducting type heavily-doped back implantation may also be performed to the thinned semiconductor substrate to form the drain region.

A back metal layer 12 is formed on the back surface of the drain region. In embodiment 3 of the disclosure, the backside process of the super junction device does not need to be defined through photolithography, so the backside process of the super junction device is included in the sixth layer photolithography process in FIG. 6.

In embodiment 3 of the disclosure, the super junction device is an N-type device, the first conducting type is N-type, and the second conducting type is P-type. In other embodiments, the super junction device may be a P-type device, the first conducting type may be P-type, and the second conducting type may be N-type.

Compared with embodiment 1 of the disclosure, in embodiment 2 of the disclosure, only the sequence of the forming process of the source region 6 and the sequence of the forming process of the super junction are exchanged. The thermal process of the forming process of the source region 6 will influence the forming process of the super junction, but on the whole, the influence is smaller than the influence of the thermal process on the super junction in the existing method.

Embodiment 4 of the disclosure provides a method for making a super junction device.

Figure 7:
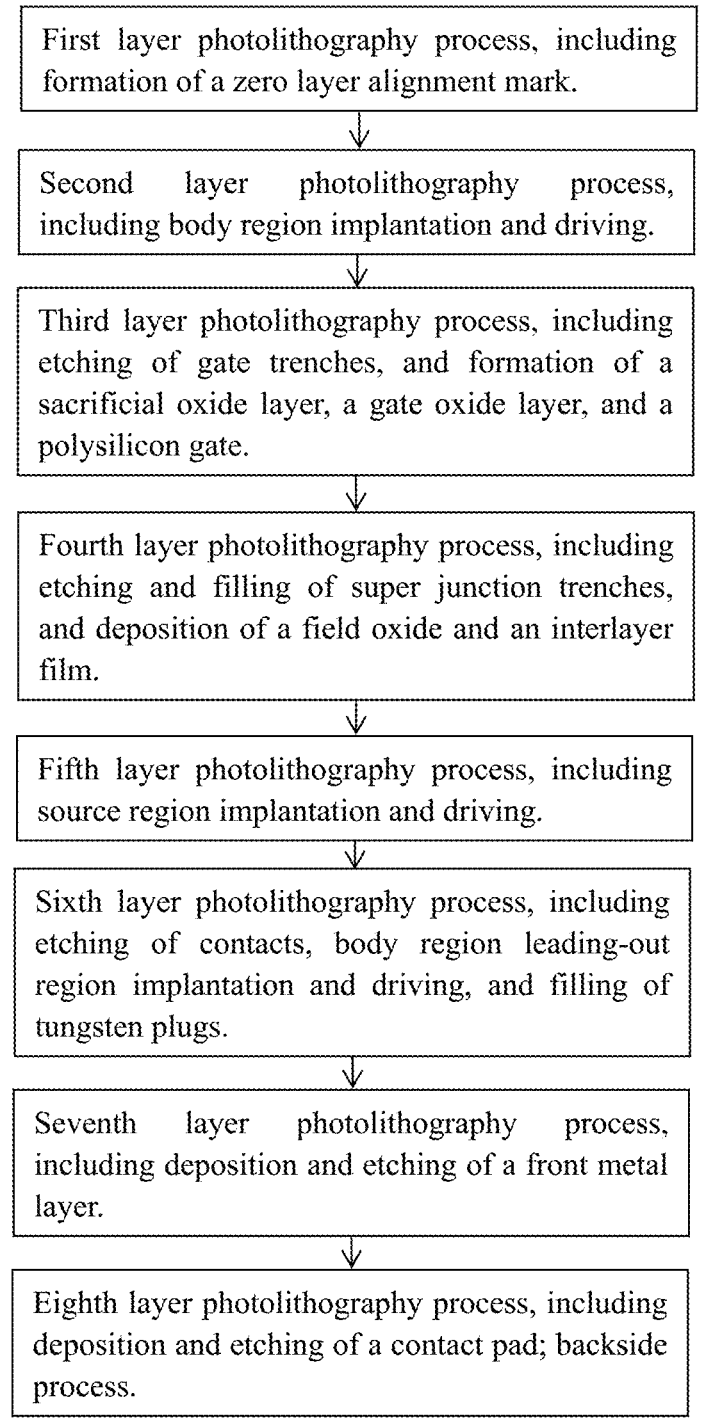
FIG. 7 is a flowchart of a method for making a super junction device according to embodiment 4 of the present invention.

Referring to FIG. 7, it is a flowchart of the method for making the super junction device according to embodiment 4 of the disclosure. For the schematic structural view of the device in each step in the method for making the super junction device according to embodiment 4 of the disclosure, please also refer to FIG. 4A to FIG. 4N. The method for making the super junction device according to embodiment 4 of the disclosure includes the following steps:

Referring to FIG. 4A, a first conducting type first epitaxial layer 2 is provided.

The first epitaxial layer 2 is formed on a semiconductor substrate 1. Generally, the semiconductor substrate 1 is a silicon substrate.

A photolithography process is performed by adopting a zero layer mask and a zero layer alignment mark is formed. The process of forming the zero layer alignment mark corresponds to the first layer photolithography process in FIG. 7.

Referring to FIG. 4D, the forming process of the body region 5 is performed. The forming area of the body region 5 is defined through photolithography. The body region 5 is formed by adopting an ion implantation and annealing driving process. The forming process of the body region 5 corresponds to the second layer photolithography process in FIG. 7.

In step 1, the gate structure is formed. The gate structure is a trench gate. The forming process of the trench gate includes the following steps:

A first conducting type first epitaxial layer 2 is provided and a photolithography process is performed to define the forming area of gate trenches 201.

Referring to FIG. 4A, a first conducting type first epitaxial layer 2 is provided. The first epitaxial layer 2 is formed on the surface of a semiconductor substrate 1, for example, a silicon substrate. A photolithography process is performed to define the forming area of gate trenches 201.

Referring to FIG. 4B, the first epitaxial layer 2 is etched to form the gate trenches 201. The width of the gate trench 201 at the leading-out position of the gate structure satisfies the requirement of forming contacts 10.

Referring to FIG. 4B, a gate oxide layer 3 is formed on the side surfaces of the gate trenches 201, and a bottom oxide layer is formed on the bottom surfaces of the gate trenches 201.

Referring to FIG. 4C, a polysilicon gate 4 is filled in the gate trenches 201. The gate oxide layer 3, the bottom oxide layer and the polysilicon gate 4 formed in the gate trenches 201 form the trench gate.

First flattening is performed such that the surface of the first epitaxial layer 2 with the trench gate is a flat surface.

According to some embodiments, before performing the photolithography process to define the gate trenches 201, the method further includes the step of forming a first hard mask layer on the surface of the first epitaxial layer 2, then firstly etching the first hard mask layer, and then etching the first epitaxial layer 2 to form the gate trenches 201.

The first hard mask layer is removed after the first flattening stops on the first hard mask layer.

The first flattening is realized by adopting a back etching process or a chemical-mechanical polishing process.

In step 1, after etching the gate trenches 201 and before forming the gate oxide layer 3, the method further includes the step of performing rounding to the gate trenches 201, and the rounding includes the following steps:

A first sacrificial oxide layer is formed by adopting a thermal oxidation process.

The first sacrificial oxide layer is removed.

The gate oxide layer 3 is formed on the side surfaces of the gate trenches 201 by adopting the thermal oxidation process.

In embodiment 4 of the disclosure, the bottom oxide layer and the gate oxide layer 3 are formed at the same time by adopting the same thermal oxidation process, so the bottom oxide layer and the gate oxide layer 3 are the same oxide layer with the same thickness, and are marked with reference sign 3. In other embodiments, the thickness of the bottom oxide layer may be greater than the thickness of the gate oxide layer 3, and the bottom oxide layer and the gate oxide layer 3 are formed separately. Generally, the thicker bottom oxide layer is formed firstly, and then the gate oxide layer 3 is formed by adopting the thermal oxidation process. Amorphous ion implantation may be firstly performed to the bottom of the gate trenches 201, and then thermal oxidation is performed to form the bottom oxide layer and the gate oxide layer 3 at the same time. Since the amorphous ion implantation is performed to the bottom of the gate trenches 201, the thermal oxidation speed of the bottom of the gate trenches 201 is accelerated, and the thickness of the bottom oxide layer is greater than the thickness of the gate oxide layer 3. The increase of the thickness of the bottom oxide layer facilitates the improvement of the pressure resistance of the bottom of the gate trenches 201.

The forming process of the trench gate corresponds to the third layer photolithography process in FIG. 7.

In step 2, the forming process of the super junction is performed and includes the following steps:

Referring to FIG. 4F, a photolithography process is performed to the flat surface of the first epitaxial layer 2 with the trench gate to define the forming area of super junction trenches 205.

Referring to FIG. 4F, the first epitaxial layer 2 is etched to form the super junction trenches 205.

Referring to FIG. 4G, a second conducting type second epitaxial layer 7 is filled in the super junction trenches 205, the second epitaxial layer 7 filled in the super junction trenches 205 forms second conducting type pillars, the first epitaxial layer 2 between the second conducting type pillars forms first conducting type pillars, and the first conducting type pillars and the second conducting type pillars are arranged alternately to form the super junction.

Referring to FIG. 4H, second flattening is performed such that the surface of the first epitaxial layer 2 with the super junction is a flat surface.

According to some embodiments, a second hard mask layer is adopted in the forming process of the super junction, and when the second hard mask layer is adopted, the forming process of the super junction includes the following steps:

Referring to FIG. 4F, the second hard mask layer is formed. The second hard mask layer is formed by a second bottom oxide layer 202, a middle nitride layer 203 and a top oxide layer 204 in a stacking manner.

The forming area of the super junction trenches 205 is defined by adopting a photolithography process.

The second hard mask layer and the first epitaxial layer 2 are sequentially etched to form the super junction trenches 205.

Referring to FIG. 4G, the top oxide layer 204 of the second hard mask layer is removed, a second sacrificial oxide layer is formed by adopting a thermal oxidation process, and then the second sacrificial oxide layer is removed.

Referring to FIG. 4G, the middle nitride layer 203 of the second hard mask layer is removed.

Referring to FIG. 4G, epitaxial filling is performed in the super junction trenches 205 to form the second epitaxial layer 7.

Referring to FIG. 4H, a chemical-mechanical polishing process is performed to the second epitaxial layer 7 to realize the second flattening, such that the second epitaxial layer 7 is only filled in the super junction trenches 205.

The second bottom oxide layer 202 of the second hard mask layer is fully removed or part of the thickness is removed.

Step 2 corresponds to the fourth layer photolithography process in FIG. 7.

After step 2, the method further includes the following steps:

Referring to FIG. 4E, the forming process of a source region 6 is performed. The forming area of the source region 6 is defined through photolithography. The source region 6 is formed by adopting an ion implantation and annealing driving process. In the device cell region, the source region 6 is self-aligned with the side surface of the corresponding gate structure.

The source region 6 is not formed in the terminal region, so the source region 6 needs to be defined by adopting a layer of mask, and the forming process of the source region 6 corresponds to the fifth layer photolithography process in FIG. 7.

Referring to FIG. 4I, a field oxide 8 is formed. In embodiment 4 of the disclosure, after the formation of the field oxide 8, it is not necessary to etch the field oxide 8 to open the device cell region, so one mask can be saved in the forming process of the field oxide 8. In FIG. 7, the forming process of the field oxide 8 is still classified into the fourth layer photolithography process in FIG. 7. In addition, the field oxide 8 is not patterned through the photolithography process and the etching process, such that the field oxide 8 includes a non-slope-climbing flat structure.

Referring to FIG. 4J, an interlayer film 9 is formed. The interlayer film 9 covers the flat surface of the field oxide 8. Since the field oxide 8 includes a non-slope-climbing flat structure, the BPSG reflow process required for the flattening of the interlayer film 9 is cancelled in the forming process of the interlayer film 9, and the thermal process can be saved by canceling the BPSG reflow process. Since the BPSG reflow process is no longer needed, the interlayer film 9 does not need to be formed by adopting the BPSG oxidation process. In embodiment 4 of the disclosure, the interlayer film 9 is formed by adopting the USG oxidation process or TEOS oxidation process. In FIG. 7, the forming process of the interlayer film 9 is still classified into the fourth layer photolithography process in FIG. 7.

Contacts 10 are formed. The forming area of the contacts 10 is defined through photolithography. The forming process of the contacts 10 includes the following sub-steps:

Referring to FIG. 4J, the forming area of the contacts 10 is defined by adopting a photolithography process, and then the interlayer film 9 and the field oxide 8 are etched sequentially to form openings 206 of the contacts 10.

In FIG. 4J, in the device cell region, the openings 206 are only located in the top of the corresponding source region 6 and the body region 5. An opening 206a with width greater than that of the opening 206 is further formed in the periphery of the device cell region, and the bottom of the opening 206a opens the corresponding second conducting type pillars and the body region 5.

In FIG. 4J, the openings 206 of the contacts 10 are not formed in the top of the polysilicon gate 4 of the gate structure in the device cell region. Referring to FIG. 4K, it illustrates the leading-out position of the gate structure. It can be seen that the width of the gate trench 201 at the leading-out position of the gate structure satisfies the requirement of forming the contacts 10. Therefore, in FIG. 4K, the openings 206 of the contacts 10 are formed in the top of the polysilicon gate 4 at the leading-out position of the gate structure.

Generally, after the openings 206 and the openings 206a are formed, the method further includes the step of performing body region leading-out region implantation of second conducting type heavily-doped ions. The body region leading-out region is implanted into the bottoms of the openings 206 and the opening 206a corresponding to the source region 6 to form a body region leading-out region to realize subsequent Ohmic contact between the contacts 10 and the body region 5.

Then, a metal, for example, tungsten is filled into the openings 206 and the openings 206a to form the contacts 10.

The forming process of the contacts 10 corresponds to the sixth layer photolithography process in FIG. 7.

Referring to FIG. 4L, a front metal layer 11 is formed. The front metal layer 11 is patterned by adopting a photolithography definition and etching process. The patterned front metal layer 11 usually forms a source electrode structure connected with the source region 6 and the body region 5, and a gate electrode structure connected with the polysilicon gate 4. The gate electrode structure is in contact with the polysilicon gate through the contacts at the leading-out position of the gate structure. The forming process of the front metal layer 11 corresponds to the seventh layer photolithography process in FIG. 7.

Referring to FIG. 4M, a contact pad is formed. The forming area of the contact pad is defined through photolithography. The contact pad is usually formed by the front metal layer 11 at the topmost layer. The contact pad includes a source electrode pad leading out the source electrode structure and a gate electrode pad leading out the gate electrode structure. The forming process of the contact pad corresponds to the eighth layer photolithography process in FIG. 7.

The backside process of the super junction device is completed. The backside process of the super junction device includes the following steps:

Back thinning is performed to the semiconductor substrate 1.

The thinned semiconductor substrate 1 is directly used as a drain region. In this case, the semiconductor substrate 1 is required to have the feature of first conducting type heavy doping. First conducting type heavily-doped back implantation may also be performed to the thinned semiconductor substrate to form the drain region.

A back metal layer 12 is formed on the back surface of the drain region. In embodiment 4 of the disclosure, the backside process of the super junction device does not need to be defined through photolithography, so the backside process of the super junction device is included in the eighth layer photolithography process in FIG. 7.

In embodiment 4 of the disclosure, the super junction device is an N-type device, the first conducting type is N-type, and the second conducting type is P-type. In other embodiments, the super junction device may be a P-type device, the first conducting type may be P-type, and the second conducting type may be N-type.

Compared with embodiment 2 of the disclosure, in embodiment 4 of the disclosure, only the sequence of the forming process of the source region 6 and the sequence of the forming process of the super junction are exchanged. The thermal process of the forming process of the source region 6 will influence the forming process of the super junction, but on the whole, the influence is smaller than the influence of the thermal process on the super junction in the existing method.

The disclosure has been described above in detail through specific embodiments, which, however, do not constitute restrictions on the disclosure. Without departing from the principle of the disclosure, those skilled in the art may also make many modifications and improvements, which should also be regarded as included the protection scope of the disclosure.

What is claimed is:

1. A method for making a super junction device, wherein the method for making the super junction device is realized by adopting an all flat process such that the forming process of a gate structure is before the forming process of a super junction, and comprises the following steps:

step 1: forming the gate structure, the gate structure being a trench gate, the forming process of the trench gate comprising:
providing a first conducting type first epitaxial layer and performing a photolithography process to define the forming area of gate trenches;
etching the first epitaxial layer to form the gate trenches, the width of the gate trench at the leading-out position of the gate structure satisfying the requirement of forming contacts;
forming a gate oxide layer on the side surfaces of the gate trenches, and forming a bottom oxide layer on the bottom surfaces of the gate trenches;
filling a polysilicon gate in the gate trenches, the gate oxide layer, the bottom oxide layer and the polysilicon gate formed in the gate trenches forming the trench gate;
performing first flattening such that the surface of the first epitaxial layer with the trench gate is a flat surface;

step 2: performing the forming process of the super junction, comprising:
performing a photolithography process to the flat surface of the first epitaxial layer with the trench gate to define the forming area of super junction trenches;
etching the first epitaxial layer to form the super junction trenches;
filling a second conducting type second epitaxial layer in the super junction trenches, the second epitaxial layer filled in the super junction trenches forming second conducting type pillars, the first epitaxial layer between the second conducting type pillars forming first conducting type pillars, and the first conducting type pillars and the second conducting type pillars being arranged alternately to form the super junction;
performing second flattening such that the surface of the first epitaxial layer with the super junction is a flat surface.

2. The method for making the super junction device according to claim 1, wherein in step 1, before performing the photolithography process to define the gate trenches, the method further comprises the step of forming a first hard mask layer on the surface of the first epitaxial layer, then firstly etching the first hard mask layer, and then etching the first epitaxial layer to form the gate trenches;
removing the first hard mask layer after the first flattening stops on the first hard mask layer.

3. The method for making the super junction device according to claim 1, wherein in step 1, after etching the gate trenches and before forming the gate oxide layer, the method further comprises the step of performing rounding to the gate trenches, and the rounding comprises:
forming a first sacrificial oxide layer by adopting a thermal oxidation process;
removing the first sacrificial oxide layer.

4. The method for making the super junction device according to claim 3, wherein the gate oxide layer is formed on the side surfaces of the gate trenches by adopting the thermal oxidation process.

5. The method for making the super junction device according to claim 4, wherein the bottom oxide layer and the gate oxide layer are formed at the same time by adopting the same process; or
the thickness of the bottom oxide layer is greater than the thickness of the gate oxide layer, and the bottom oxide layer and the gate oxide layer are formed separately.

6. The method for making the super junction device according to claim 1, wherein the method further comprises the following step: forming a body region by adopting an ion implantation and annealing driving process, and the forming area of the body region is defined through photolithography.

7. The method for making the super junction device according to claim 6, wherein the forming process of the body region is arranged before step 2.

8. The method for making the super junction device according to claim 7, wherein the forming process of the body region is arranged before step 1, and before forming the body region, the method further comprises the step of performing a photolithography process by adopting a zero layer mask and forming a zero layer alignment mark.

9. The method for making the super junction device according to claim 7, wherein the forming process of the body region is arranged after step 1.

10. The method for making the super junction device according to claim 1, wherein the method further comprises the following step: forming a source region by adopting an ion implantation and annealing driving process, the forming area of the source region is defined through photolithography, and in the device cell region, the source region is self-aligned with the side surface of the gate structure.

11. The method for making the super junction device according to claim 10, wherein the forming process of the source region is arranged after step 1 and before step 2.

12. The method for making the super junction device according to claim 10, wherein the forming process of the source region is arranged after step 2.

13. The method for making the super junction device according to claim 1, wherein after step 2, the method further comprises the following steps:

forming a field oxide, an interlayer film, and contacts, the forming area of the contacts being defined through photolithography, the corresponding contacts being formed at the leading-out position of the gate structure;

then forming a front metal layer, and patterning the front metal layer by adopting a photolithography definition and etching process, an electrode formed by the patterned front metal layer comprising a gate electrode structure, the gate electrode structure being in contact with the polysilicon gate through the contacts at the leading-out position of the gate structure;

forming a contact pad, the forming area of the contact pad being defined through photolithography;

completing the backside process of the super junction device.

14. The method for making the super junction device according to claim 13, wherein the field oxide comprises a non-slope-climbing flat structure and the interlayer film covers the surface of the flat field oxide;

the interlayer film is formed by adopting a USG oxidation process or TEOS oxidation process.

15. The method for making the super junction device according to claim 13, wherein the first epitaxial layer is formed on a semiconductor substrate and the backside process of the super junction device comprises:

performing back thinning to the semiconductor substrate;

directly using the thinned semiconductor substrate as a drain region, or performing first conducting type heavily-doped back implantation to the thinned semiconductor substrate to form the drain region;

forming a back metal layer on the back surface of the drain region.

16. The method for making the super junction device according to claim 1, wherein in step 2, a second hard mask layer is adopted in the forming process of the super junction, the second hard mask layer is formed by a second bottom oxide layer, a middle nitride layer and a top oxide layer in a stacking manner, and when the second hard mask layer is adopted, the forming process of the super junction comprises the following steps:

forming the second hard mask layer;

defining the forming area of the super junction trenches by adopting a photolithography process;

sequentially etching the second hard mask layer and the first epitaxial layer to form the super junction trenches;

removing the top oxide layer of the second hard mask layer, forming a second sacrificial oxide layer by adopting a thermal oxidation process, and then removing the second sacrificial oxide layer;

removing the middle nitride layer of the second hard mask layer;

performing epitaxial filling in the super junction trenches to form the second epitaxial layer;

performing a chemical-mechanical polishing process to the second epitaxial layer to realize the second flattening, such that the second epitaxial layer is only filled in the super junction trenches;

fully removing the second bottom oxide layer of the second hard mask layer or removing part of the thickness.

17. The method for making the super junction device according to claim 1, wherein the first flattening is realized by adopting a back etching process or a chemical-mechanical polishing process.

* * * * *